US012660171B2

(12) United States Patent
Song et al.

(10) Patent No.: US 12,660,171 B2
(45) Date of Patent: Jun. 16, 2026

(54) SEMICONDUCTOR MEMORY DEVICE AND MANUFACTURING METHOD THEREOF

(71) Applicant: SAMSUNG ELECTRONICS CO., LTD., Suwon-si (KR)

(72) Inventors: Younggeun Song, Suwon-si (KR); Sanghoon Uhm, Suwon-si (KR); Yongjin Lee, Suwon-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 18/239,268

(22) Filed: Aug. 29, 2023

(65) Prior Publication Data

US 2024/0244831 A1     Jul. 18, 2024

(30) Foreign Application Priority Data

Jan. 17, 2023     (KR) ........................ 10-2023-0006956

(51) Int. Cl.
H10B 12/00          (2023.01)

(52) U.S. Cl.
CPC ........... H10B 12/482 (2023.02); H10B 12/02 (2023.02); H10B 12/315 (2023.02); H10B 12/488 (2023.02); H10B 12/50 (2023.02)

(58) Field of Classification Search
CPC ................................................... H10B 12/482
See application file for complete search history.

(56) References Cited

U.S. PATENT DOCUMENTS

| | | | |
|---|---|---|---|
| 7,180,115 B1 | 2/2007 | Hofmann et al. | |
| 7,547,945 B2 | 6/2009 | Tang et al. | |
| 8,324,682 B2 * | 12/2012 | Chen ..................... | H10B 12/36 257/E21.375 |

(Continued)

FOREIGN PATENT DOCUMENTS

| | | |
|---|---|---|
| KR | 10-2002-0058011 A | 7/2002 |
| KR | 10-2013-0103942 A | 9/2013 |

(Continued)

OTHER PUBLICATIONS

Liao, et al. "The comprehensive study and the reduction of contact resistivity on the n-InGaAs M-I-S contact system with different inserted insulators", AIP Advances 5, 057117 (2015), pp. 057117-1-057117-4.

(Continued)

*Primary Examiner* — Evren Seven
(74) *Attorney, Agent, or Firm* — MORGAN, LEWIS & BOCKIUS LLP

(57)          ABSTRACT
A semiconductor device includes a bit line extending in a first direction on a substrate. A first insulating pattern is disposed on the bit line. A channel pattern is disposed on an upper side of the bit line and a lateral side of the first insulating pattern. The channel pattern includes an oxide semiconductor material. A gate insulating pattern is disposed on the channel pattern. Word lines are disposed on the gate insulating pattern. A second insulating pattern is disposed on the word lines. A landing pad is disposed on the channel pattern. An interlayer insulating layer disposed between the bit line and the channel pattern.

20 Claims, 20 Drawing Sheets

(56) References Cited

U.S. PATENT DOCUMENTS

| | | | | |
|---|---|---|---|---|
| 8,372,715 | B2 * | 2/2013 | Chung | H10B 12/488 |
| | | | | 438/270 |
| 8,772,862 | B2 * | 7/2014 | Cho | H10B 12/31 |
| | | | | 438/242 |
| 9,136,376 | B2 | 9/2015 | Moon et al. | |
| 10,177,153 | B2 | 1/2019 | Kang | |
| 10,411,013 | B2 | 9/2019 | Godo et al. | |
| 11,296,107 | B2 | 4/2022 | Liu et al. | |
| 12,408,382 | B2 | 9/2025 | Jeong et al. | |
| 12,453,078 | B2 * | 10/2025 | Kim | H10D 30/6757 |
| 2019/0326296 | A1 * | 10/2019 | Wang | H10B 12/50 |
| 2020/0043941 | A1 * | 2/2020 | Kim | H10B 43/40 |
| 2020/0083225 | A1 * | 3/2020 | Ma | G11C 11/401 |
| 2020/0251151 | A1 * | 8/2020 | Kang | H10B 12/03 |
| 2022/0028859 | A1 * | 1/2022 | Hong | H10B 12/482 |
| 2022/0102352 | A1 * | 3/2022 | Lee | H10B 12/395 |
| 2022/0189828 | A1 | 6/2022 | Torek | |
| 2022/0285352 | A1 * | 9/2022 | Chen | H10B 12/05 |
| 2022/0285353 | A1 * | 9/2022 | Cho | H10B 12/05 |
| 2023/0055147 | A1 * | 2/2023 | Lee | H10D 30/6728 |

FOREIGN PATENT DOCUMENTS

| | | | |
|---|---|---|---|
| KR | 10-2021-0076075 A | 6/2021 | |
| KR | 10-2022-0155508 A | 11/2022 | |

OTHER PUBLICATIONS

Sporea, et al. "Novel Tunnel-Contact-Controlled IGZO Thin-Film Transistors with High Tolerance to Geometrical Variability", Adv. Mater. 2019, 31, 1902551, 9 pages.

Gupta, et al., "Accurate Determination of Ultrathin Gate Oxide Thickness and Effective Polysilicon Doping of CMOS Devices", IEEE Electron Device Letters, vol. 18, No. 12, Dec. 12, 1997, pp. 580-582.

Notice of Allowance dated Apr. 23, 2026 issued in Korean Patent Application No. KR 10-2023-0006956, with English translation.

* cited by examiner

SEMICONDUCTOR MEMORY DEVICE AND MANUFACTURING METHOD THEREOF

CROSS-REFERENCE TO RELATED APPLICATION

This application claims priority under 35 U.S.C. § 119 to Korean Patent Application No. 10-2023-0006956, filed on Jan. 17, 2023 in the Korean Intellectual Property Office, the disclosure of which is incorporated by reference in its entirety herein.

1. TECHNICAL FIELD

The present disclosure relates to a semiconductor memory device and a manufacturing method thereof.

2. DISCUSSION OF RELATED ART

Consumer demand for a high integration level for semiconductor memory devices has increased to provide semiconductor memory devices having an excellent performance and an inexpensive price.

The integration level of two-dimensional (2D) or surface semiconductor memory devices is generally determined by an area of a unit memory cell which is substantially influenced by the skill level for forming fine patterns. However, very expensive equipment is typically required to generate fine patterns. Therefore, even when the integration level of the 2D semiconductor memory devices increases, the cost efficiency of the process may limit the feasibleness of the semiconductor memory device. Accordingly, semiconductor memory devices including vertical channel transistors having channels that vertically extend have been proposed to provide a semiconductor memory device having a high level of integration and cost efficiency.

SUMMARY

The present disclosure provides a semiconductor device increasing electrical characteristics by reducing contact resistance on an interface between a channel and an electrode, and a manufacturing method thereof.

According to an embodiment of the present disclosure, a semiconductor device includes a bit line extending in a first direction on a substrate. A first insulating pattern is disposed on the bit line. A channel pattern is disposed on an upper side of the bit line and a lateral side of the first insulating pattern. The channel pattern includes an oxide semiconductor material. A gate insulating pattern is disposed on the channel pattern. Word lines are disposed on the gate insulating pattern. A second insulating pattern is disposed on the word lines. A landing pad is disposed on the channel pattern. An interlayer insulating layer disposed between the bit line and the channel pattern.

In an embodiment, the channel pattern may include first and second perpendicular portions facing each other and a horizontal portion connecting the first and second perpendicular portions to each other. The horizontal portion may be disposed on an upper side of the bit line. The first and second perpendicular portions may be disposed on a lateral side of the first insulating pattern.

In an embodiment, a thickness of the interlayer insulating layer may be less than or equal to about 1 nm.

In an embodiment, the bit line may include a plurality of bit lines spaced apart from each other in a second direction traversing the first direction.

In an embodiment, the semiconductor device may further include a lower insulation layer disposed between adjacent bit lines of the plurality of bit lines. The interlayer insulating layer may be disposed to cover an upper side of the bit line, an upper side of the lower insulation layer and a bottom surface of the first insulating pattern.

In an embodiment, the interlayer insulating layer may be disposed in a region overlapping a horizontal portion of the channel pattern and the bit line.

In an embodiment, the interlayer insulating layer may include at least one compound selected from $Al_2O_3$, ZnO, $TiO_2$, CdO, and $BaTiO_3$.

In an embodiment, the oxide semiconductor material may include at least one material selected from an amorphous IGZO, an amorphous ITO, and an amorphous IGTO.

In an embodiment, the word line may include first and second word lines facing each other. The first and second word lines are disposed between the first and second perpendicular portions and are disposed above the horizontal portion.

In an embodiment, the gate insulating pattern may be disposed between the first perpendicular portion and the first word line and between the second perpendicular portion and the second word line.

According to an embodiment of the present disclosure, a semiconductor device includes a peripheral circuit structure body including a peripheral circuit element disposed on a substrate and an inter-wire insulation layer covering the peripheral circuit element. A bit line is disposed on the peripheral circuit structure body. A first insulating pattern is disposed on the bit line. A channel pattern is disposed on an upper portion side of the bit line and a lateral side of the first insulating pattern. The channel pattern includes first and second perpendicular portions facing each other, and a horizontal portion connecting the first and second perpendicular portions to each other. A gate insulating pattern covers the first and second perpendicular portions and the horizontal portion. First and second word lines face each other. The first and second word lines are disposed between the first and second perpendicular portions and on the gate insulating pattern. A second insulating pattern is disposed on the first and second word lines. A landing pad is disposed on the channel pattern. An interlayer insulating layer is disposed between the bit line and the horizontal portion of the channel pattern.

In an embodiment, a thickness of the interlayer insulating layer may be less than or equal to about 1 nm.

In an embodiment, the interlayer insulating layer may include at least one compound selected from $Al_2O_3$, ZnO, $TiO_2$, CdO, and $BaTiO_3$.

In an embodiment, a lower side of the horizontal portion of the channel pattern directly contacts an upper side of the interlayer insulating layer.

In an embodiment, the channel pattern may include an oxide semiconductor material.

In an embodiment, the oxide semiconductor material may include at least one material selected from an amorphous IGZO, an amorphous ITO, and an amorphous IGTO.

According an embodiment of the present disclosure provides a method for manufacturing a semiconductor device includes: forming a bit line extending in a first direction on a substrate; forming an interlayer insulating layer on the bit line; forming a first insulating pattern on the interlayer insulating layer; forming a channel pattern on the interlayer insulating layer and the first insulating pattern; forming a gate insulating pattern on the channel pattern; forming a word line on the gate insulating pattern; exposing at least a portion of the channel pattern; forming a second insulating pattern on the word line; and forming a landing pad on the exposed channel pattern.

In an embodiment, the forming of an interlayer insulating layer on the bit line may be performed by using at least one process selected from atomic layer deposition and chemical vapor deposition.

In an embodiment, in the forming of an interlayer insulating layer in the bit line, the interlayer insulating layer may be formed to have a thickness of less than or equal to about 1 nm.

In an embodiment, in the forming of an interlayer insulating layer in the bit line, the interlayer insulating layer may be formed by using a material including at least one compound selected from $Al_2O_3$, ZnO, $TiO_2$, CdO, and $BaTiO_3$.

According to embodiments of the present disclosure, as the interlayer insulating layer is disposed between the bit line and the channel pattern, diffusion of oxygen to the bit line may be intercepted, and diffusion of hydrogen to the channel may also be intercepted, thereby preventing deterioration of the device characteristics and increasing reliability of the semiconductor device.

By using the tunneling and removing Fermi-level pinning, the interface resistance and the dispersion between the bit line and the channel pattern may be reduced, and the electrical characteristics of the semiconductor device may be significantly increased.

In addition, as using the tunneling phenomenon that has low temperature dependence, the semiconductor device of the present embodiment may substantially reduce the generation of errors according to a change of temperatures and may increase reliability of the semiconductor device.

The interlayer insulating layer is disposed between the bit line and the channel pattern, so the leakage current may be reduced in the static state.

The various and beneficial merits and effects of the present disclosure are not limited to the above-described content, and will be more easily understood in the course of describing non-limiting embodiments of the present disclosure.

DETAILED DESCRIPTION OF EMBODIMENTS

Figure 1:
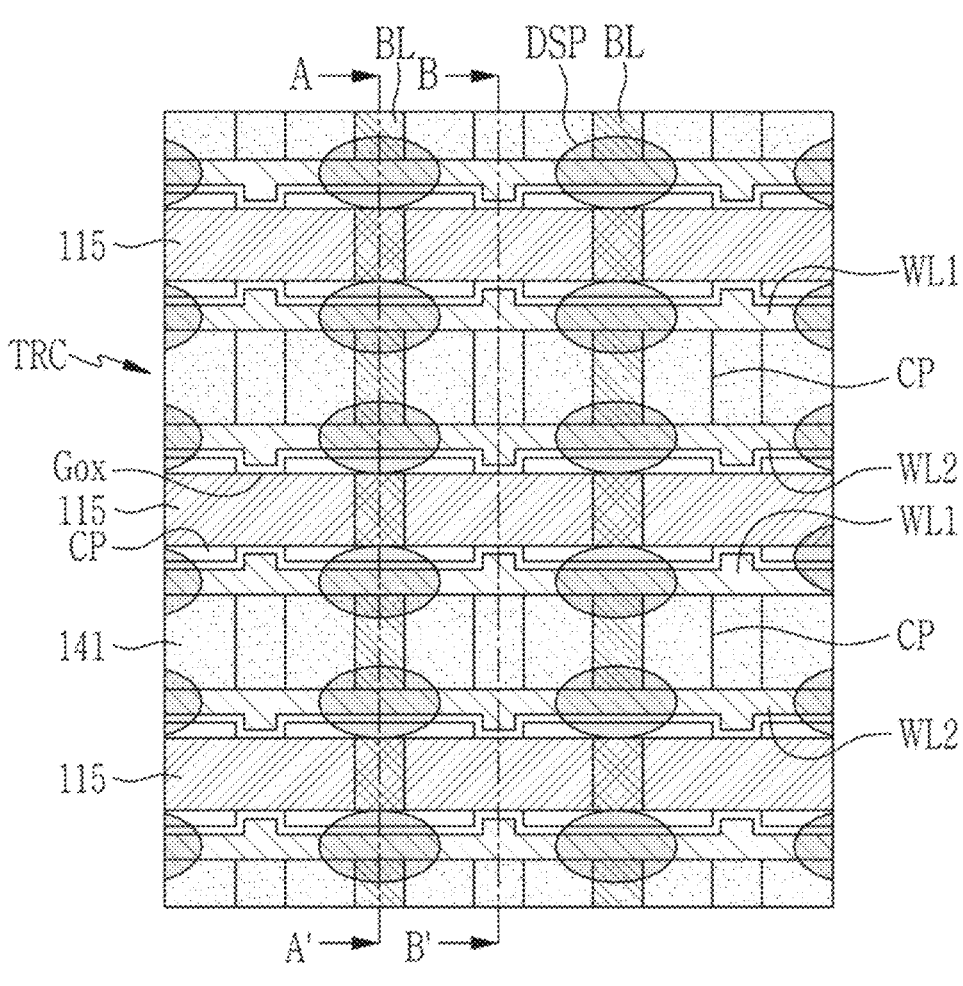
FIG. 1 shows a top plan view of a semiconductor device according to an embodiment.
Figure 1:
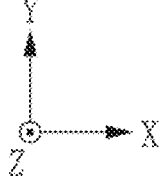

The present disclosure will be described more fully hereinafter with reference to the accompanying drawings, in which non-limiting embodiments of the present disclosure are shown. As those skilled in the art would realize, the described embodiments may be modified in various different ways, all without departing from the spirit or scope of the present disclosure.

Parts that are irrelevant to the description may be omitted to clearly describe the present disclosure, and the same elements will be designated by the same reference numerals throughout the specification.

The size and thickness of each configuration shown in the drawings may be arbitrarily shown for better understanding and ease of description. However, embodiments of the present disclosure are not necessarily limited thereto. In the drawings, the thickness of layers, films, panels, regions, etc., may be enlarged for clarity. The thicknesses of some layers and areas may be exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A semiconductor device according to an embodiment will now be described with reference to FIGS. 1-3. In detail, FIG. 1 shows a top plan view of a semiconductor device according to an embodiment, FIG. 2 shows a cross-sectional view with respect to lines A-A' and B-B' of FIG. 1, and FIG. 3 shows a partially enlarged view of a portion P1 of FIG. 2.

Figure 2:
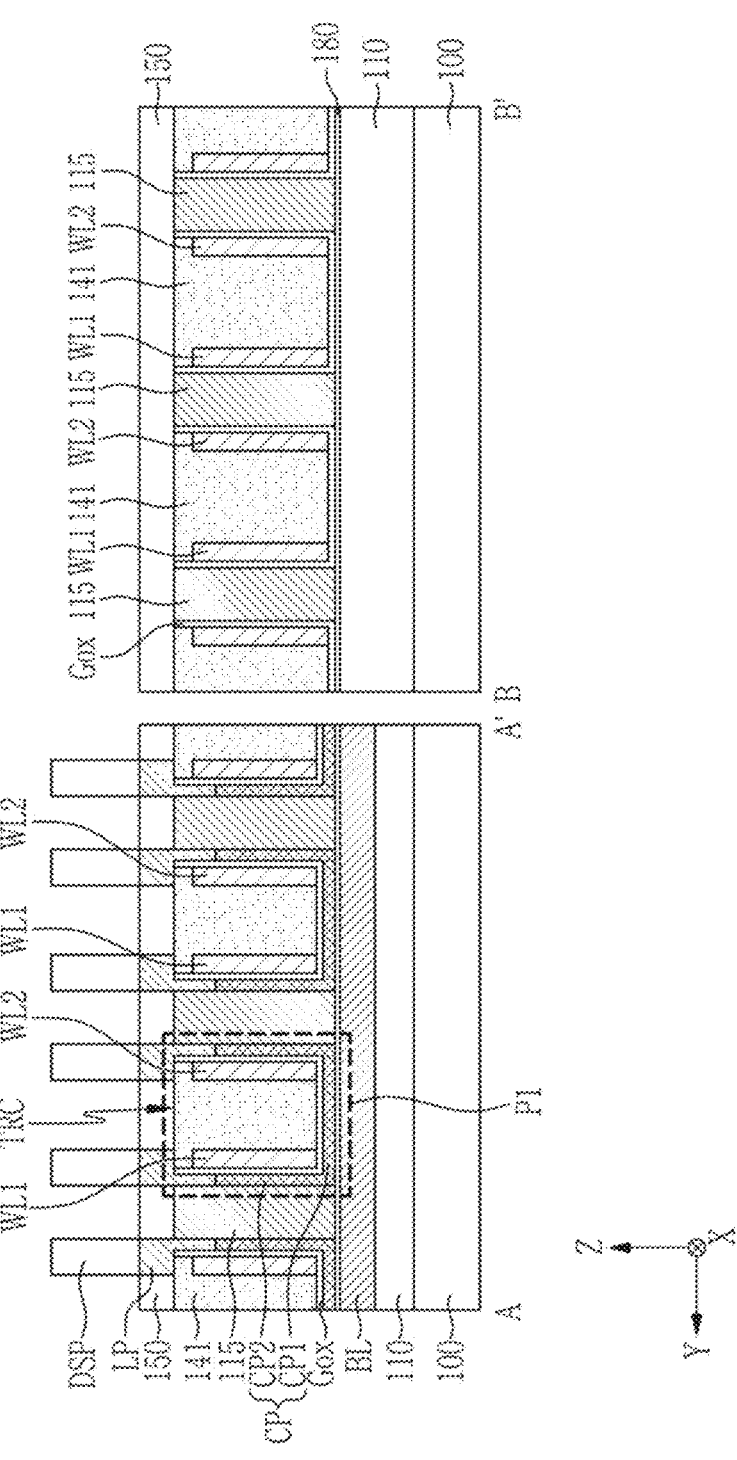
FIG. 2 shows a cross-sectional view with respect to lines A-A' and B-B' of FIG. 1.
Figure 3:
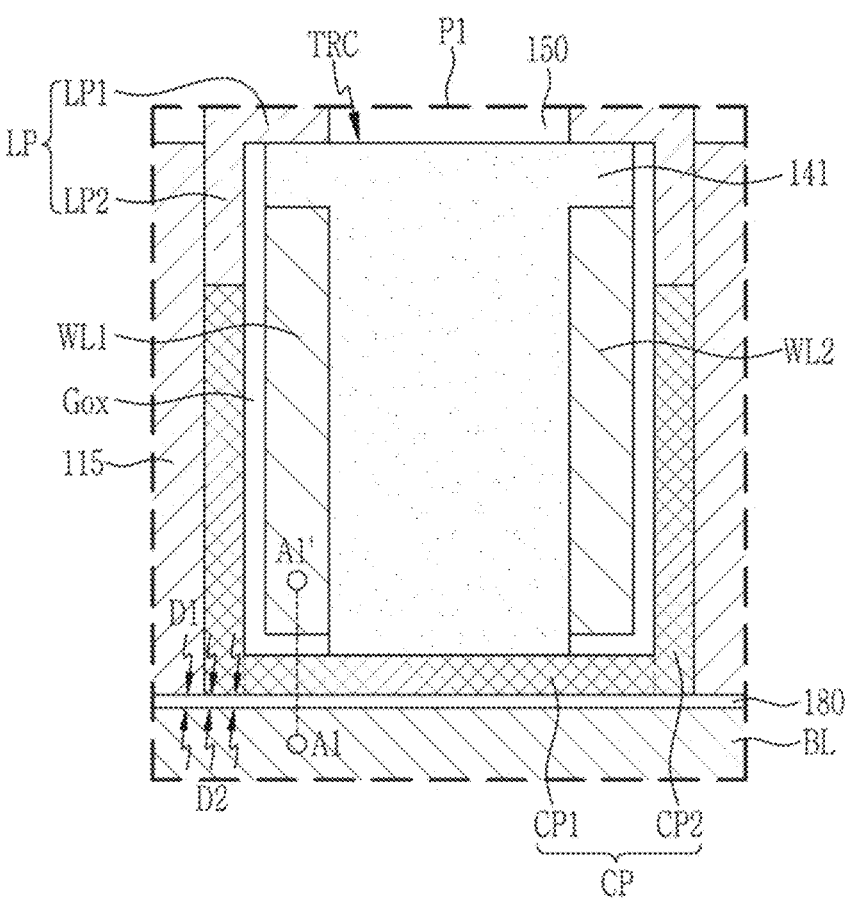
FIG. 3 shows a partially enlarged view of a portion P1 of FIG. 2.
Figure 3:

Referring to FIGS. 1 to 3, the semiconductor device includes a substrate 100, a bit line BL, a first insulating pattern 115, a channel pattern CP, a gate insulating pattern Gox, word lines WL1 and WL2, a second insulating pattern 141, a landing pad LP, and an interlayer insulating layer 180 disposed between the bit line and the channel pattern.

In an embodiment, the substrate 100 may be a silicon substrate, a gallium arsenic substrate, a silicon germanium substrate, or a semiconductor on insulator (SOI) substrate. However, embodiments of the present disclosure are not necessarily limited thereto. The substrate 100 will be described to be a silicon substrate for convenience of explanation.

The bit line BL may be formed on the substrate 100. For example, a lower insulation layer 110 may be formed on the substrate 100 (e.g., formed directly thereon in the Z direction), and the bit line BL may be disposed on the lower insulation layer 110 (e.g., disposed directly thereon in the Z direction). The bit line BL may extend in a first direction Y. In an embodiment, a plurality of bit lines BL may respectively extend in the first direction Y, and may be spaced apart from each other at regular intervals in a second direction X crossing the first direction Y. For example, in an embodiment, the first direction X and the second direction Y may be perpendicular to each other. However, embodiments of the present disclosure are not necessarily limited thereto and the first direction X and the second direction Y may cross each other at various different angles. The lower insulation layer 110 may be formed to fill spaces between adjacent bit lines of the bit lines BL (e.g., in the X direction). For example, in an embodiment an upper side of a portion of the lower insulation layer 110 disposed between the bit line BL may be disposed on a same level as upper sides of the bit lines BL.

In an embodiment, the bit line BL may include, for example, doped polysilicon, a metal, a conductive metal nitride, a conductive metal silicide, a conductive metal oxide, or combinations thereof. The bit lines BL may include, for example, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or combinations thereof. However, embodiments of the present disclosure are not necessarily limited thereto. The bit line BL may include a single layer or a multilayer of the above-noted materials. In an embodiment, the bit line BL may include a two-dimension (2D) semiconductor material, and for example, the 2D semiconductor material may include graphene, carbon nanotubes, or combinations thereof.

The first insulating pattern 115 may be formed on the lower insulation layer 110. In an embodiment, the first insulating pattern 115 may be disposed on the upper side of the bit line BL, and first insulating patterns 115 may traverse the bit line BL, may extend in the second direction X, and may be spaced apart from each other in the first direction Y.

The first insulating pattern 115 may form channel trenches TRC traversing the bit lines BL, extending in the second direction X, and spaced from each other in the first direction Y.

In an embodiment, the first insulating pattern 115 may include, for example, at least one compound selected from a silicon oxide, a silicon oxynitride, a silicon nitride, and a low dielectric (low-k) material that has a lower dielectric constant than the silicon oxide. However, embodiments of the present disclosure are not necessarily limited thereto.

In an embodiment, the low dielectric (low-k) material may include, for example, at least one material selected from a FOX (Flowable Oxide), TOSZ (Torene SilaZene), USG (Undoped silicate glass), BSG (Borosilicate glass), PSG (Phosphosilicate glass), BPSG (BoroPhosphosilicate glass), PETEOS (Plasma Enhanced tetra-ethyl Orthosilicate), FSG (Fluoride silicate glass), CDO (Carbon Doped silicon Oxide), Xerogel, Aerogel, Amorphous Fluorinated Carbon, OSG (Organo silicate glass), Parylene, BCB (bis-benzocyclobutene), SiLK, a polyimide, a porous polymeric material, and combinations thereof. However, embodiments of the present disclosure are not necessarily limited thereto.

The channel patterns CP may be disposed on the bit lines BL. For example, in an embodiment the channel patterns CP may be disposed on an upper side of the bit line BL and a lateral side of the first insulating pattern 115. The channel patterns CP may be spaced from each other in the first direction Y in the bit lines BL. For example, the channel patterns CP may be spaced from each other in the first direction Y and the second direction X traversing each other and may be arranged in a matrix form.

In an embodiment, the channel pattern CP may include a first source/drain region and a second source/drain region. For example, a lower portion of the channel pattern CP may be connected to the bit line BL and may function as the first source/drain region, an upper portion of the channel pattern CP may be connected to the landing pad LP and may function as the second source/drain region, and a portion of the channel pattern CP between the first source/drain region and the second source/drain region may function as the channel region.

In an embodiment, the channel patterns CP may be spaced from each other in the first direction Y in the respective channel trenches TRC. For example, the first insulating pattern 115 may be disposed among the channel patterns CP disposed adjacent to each other in the first direction Y. The channel patterns OP may be disposed in the first insulating pattern 115 and may be spaced apart and disposed in the first direction Y. For example, the channel patterns CP may extend according to a profile of the channel trench TRC. Hence, in a cross-sectional view, the channel patterns CP may have a "U" shape.

The respective channel patterns CP may include a horizontal portion CP1 extending in the first direction Y and disposed on the interlayer insulating layer 180 (e.g., disposed directly thereon in the Z direction) and first and second perpendicular portions CP2 extending in the third direction (e.g., the Z direction) and facing each other in the first direction Y.

Regarding the semiconductor device according to an embodiment shown in FIG. 3, the interlayer insulating layer 180 is disposed between the bit line BL and the channel pattern CP.

The interlayer insulating layer 180 may be disposed to cover the upper side of the bit line BL and the upper side of the lower insulation layer 110.

In an embodiment, the interlayer insulating layer 180 may be disposed in a region overlapping the horizontal portion CP1 and the bit line BL. For example, the upper side of the interlayer insulating layer 180 may directly contact the lower side of the horizontal portion CP1 of the channel pattern, and the lower side of the interlayer insulating layer 180 may directly contact the upper side of the bit line BL. Thus, the horizontal portion CP1 is disposed on (e.g., disposed indirectly thereon) an upper side of the bit line BL.

As the interlayer insulating layer 180 is disposed between the channel pattern CP and the bit line BL according to an embodiment, as shown in FIG. 3, diffusion D1 of oxygen may be intercepted in the oxygen annealing process of the channel and the bit line may be protected. Further, in the silicon and hydrogen passivation process, diffusion D2 of hydrogen to the channel may be intercepted to protect the amorphous oxide semiconductor channel. Accordingly, the device characteristics may be prevented from being deteriorated, thereby increasing reliability of the semiconductor device.

In an embodiment, the interlayer insulating layer 180 may use a material for causing Fowler-Nordheim (FN) tunneling. For example, the interlayer insulating layer 180 may dope a material for preventing oxygen from being diffused to the bit line when oxygen-annealing the channel pattern. In an embodiment, the interlayer insulating layer 180 may include, for example, at least one compound selected from Al$_2$O$_3$, ZnO, TiO$_2$, CdO, and BaTiO$_3$. However, embodiments of the present disclosure are not necessarily limited thereto.

In an embodiment, a thickness of the interlayer insulating layer 180 may be less than or equal to about 1 nm. For example, in an embodiment a thickness of the interlayer insulating layer 180 may be in a range of about 0.01 nm to about 1 nm. The semiconductor device includes the interlayer insulating layer that has the thickness less than or equal to about 1 nm so it has a low tunneling barrier, removes Fermi-level pinning, and reduces contact resistance and dispersion of the bit line and the channel pattern, thereby increasing performance of the semiconductor device.

Figure 4:
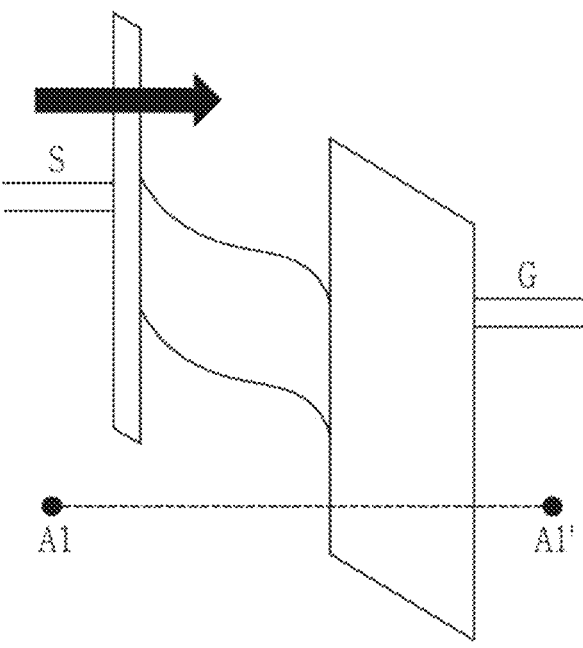
FIG. 4 shows a perspective view of a driving of an element by a tunneling according to an embodiment.

FIG. 4 shows driving of an element by tunneling in a structure in which an interlayer insulating layer is inserted between a bit line and a channel pattern according to an embodiment of the present disclosure.

Referring to FIG. 4, the thin interlayer insulating layer that has a thickness that is less than or equal to 1 nm is tunneled by the voltage applied to the bit line and the word line so the element may be normally driven.

In an embodiment, the horizontal portion CP1 of the channel patterns CP may directly contact the interlayer insulating layer 180. The horizontal portion CP1 of the channel patterns CP may directly contact the upper side of the interlayer insulating layer 180.

In an embodiment, the first and second perpendicular portions CP2 of the channel patterns CP may extend in the third direction (e.g., the Z direction) from the upper side of the interlayer insulating layer 180. The upper side of the first and second perpendicular portions CP2 may directly contact the landing pad LP to be described. The lower sides of the first and second perpendicular portions CP2 may directly contact the interlayer insulating layer 180.

In an embodiment, the upper sides of the first and second perpendicular portions CP2 may be disposed on a lower level than the upper sides of the gate insulating pattern Gox and the word lines WL1 and WL2. However, embodiments of the present disclosure are not necessarily limited thereto. For example, in an embodiment the upper sides of the first and second perpendicular portions CP2 of the channel patterns CP may be disposed on the same level or a higher level as/than the upper sides of the gate insulating pattern Gox and/or the word lines WL1 and WL2.

The first and second perpendicular portions CP2 of the channel patterns CP may face each other (e.g., in the Y direction). A first side of each of the first and second perpendicular portions CP2 may be connected to the horizontal portion CP1, and may directly contact a gate insulating pattern Gox to be described. For example, a portion of a first side of each of the first and second perpendicular portions CP2 may be connected to the lateral side of the horizontal portion CP1, and the other portion of the first side of the first and second perpendicular portions CP2 may directly contact the gate insulating pattern Gox. Hence, the horizontal portion CP1 of the channel pattern CP may be spaced apart from the first insulating pattern 115 with the first and second perpendicular portions CP2 therebetween (e.g., in the Y direction) so that the horizontal portion CP1 of the channel pattern CP may not directly contact the first insulating pattern 115.

In an embodiment, the channel pattern CP may include an oxide semiconductor material. The oxide semiconductor material may, for example, include an IGZO (indium gallium zinc oxide, $In_xGa_yZn_zO$), an IGSO (indium gallium silicon oxide, $In_xGa_ySi_zO$), an ITZO (indium tin zinc oxide, $In_xSn_yZn_zO$), an IGTO (indium gallium tin oxide, $In_xGa_y$-$Sn_zO$), an IZO (indium zinc oxide, $In_xZn_yO$), a ZnO (zinc oxide, $Zn_xO$), a ZTO (zinc tin oxide, $Zn_xSn_yO$), a ZnON (zinc oxynitride, $Zn_xO_yN$), a ZZTO (zirconium zinc tin oxide, $Zr_xZn_ySn_zO$), a SnO (tin oxide, $Sn_xO$), a HIZO (hafnium indium zinc oxide, $Hf_xIn_yZn_zO$), a GZTO (gallium zinc tin oxide, $Ga_xZn_ySn_zO$), an AZTO (aluminum zinc tin oxide, $Al_xZn_ySn_zO$), a YGZO (ytterbium gallium zinc oxide, $Yb_yGa_yZn_zO$), an IGO (indium gallium oxide, $In_xGa_yO$), or combinations thereof. For example, in an embodiment the oxide semiconductor material may include at least one of an amorphous IGZO, an amorphous ITO, and an amorphous IGTO. However, embodiments of the present disclosure are not necessarily limited thereto.

The word lines WL1 and WL2 may traverse the bit lines BL, may extend in the second direction (e.g., the X direction), and may be spaced in the first direction (e.g., the Y direction). One pair of the word lines WL1 and WL2 may be disposed on the horizontal portion CP1 (e.g., above the horizontal portion CP1 in the Z direction) and between the first and second perpendicular portions CP2 of the channel pattern CP (e.g., in the Y direction).

In an embodiment, the word lines WL1 and WL2 may respectively include a first side and a second side that is opposite to the first side (e.g., in the Y direction), and one side of each of the word lines WL1 and WL2 may face each other on the horizontal portion CP1 of the channel pattern CP. The second sides of the word lines WL1 and WL2 may be respectively provided adjacent to the first or second perpendicular portion CP2 of the channel pattern CP and may directly contact the gate insulating pattern Gox.

The upper sides of the word lines WL1 and WL2 are shown in FIG. 3 to be disposed on a higher level than the upper sides of the channel patterns CP. However, embodiments of the present disclosure are not necessarily limited thereto. For example, in an embodiment, the upper sides of the word lines WL1 and WL2 may be disposed on the same level or a lower level as/than the upper sides of the channel patterns CP.

In an embodiment, the word lines WL1 and WL2 may include, for example, doped polysilicon, a metal, a conductive metal nitride, a conductive metal silicide, a conductive metal oxide, or combinations thereof. However, embodiments of the present disclosure are not necessarily limited thereto.

The word lines WL1 and WL2 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof. However, embodiments of the present disclosure are not necessarily limited thereto.

In an embodiment, the word lines WL1 and WL2 may include a single layer or a multilayer of the above-noted materials. In an embodiment, the word lines WL1 and WL2 may include a 2D semiconductor material, and for example, the 2D semiconductor material may include graphene, carbon nanotubes, or combinations thereof. However, embodiments of the present disclosure are not necessarily limited thereto.

The gate insulating pattern Gox may be disposed between the channel patterns CP and the word lines WL1 and WL2. In an embodiment, the gate insulating pattern Gox may cover lateral sides of the channel pattern CP and the landing pad LP with a constant thickness. However, embodiments of the present disclosure are not necessarily limited thereto.

The gate insulating pattern Gox may be disposed between the lower sides of the word lines WL1 and WL2 and the horizontal portion CP1 of the channel patterns CP and between the second sides of the word lines WL1 and WL2 and the first or second perpendicular portion CP2 of the channel pattern CP. In an embodiment, the gate insulating pattern Gox may have a "U" shape in a cross-sectional view.

In an embodiment, the gate insulating pattern Gox may be made of a silicon oxide layer, a silicon oxynitride layer, a high dielectric layer having a greater dielectric constant than the silicon oxide layer, or combinations thereof. The high dielectric layer may be made of a metal oxide or a metal oxynitride. For example, the high dielectric layer usable as a gate insulating layer may be made of $HfO_2$, HfSiO, HfSiON, HfTaO, HfTiO, HfZrO, $ZrO_2$, $Al_2O_3$, or combinations thereof. However, embodiments of the present disclosure are not necessarily limited thereto.

The second insulating pattern 141 may be formed in the channel trench TRC. For example, the second insulating pattern 141 may fill the portion of the channel trench TRC remaining after the channel pattern CP, the gate insulating pattern Gox, and the word lines WL1 and WL2 are formed. The second insulating pattern 141 may be disposed on (e.g., disposed directly thereon) the word lines WL1, WL2.

In an embodiment, the second insulating pattern 141 may include, for example, at least one material selected from a silicon oxide, a silicon oxynitride, a silicon nitride, and a low dielectric (low-k) material having a smaller dielectric constant than the silicon oxide. However, embodiments of the present disclosure are not necessarily limited thereto.

The landing pads LP may overlap at least a portion of the channel pattern CP in the perpendicular direction (e.g., the Z direction). In an embodiment, the landing pads LP may be spaced from each other in the second direction X and the first direction Y and may be arranged in a matrix form. However, embodiments of the present disclosure are not necessarily limited thereto. For example, when connected to the channel pattern CP, the landing pads LP may be arranged in various forms such as a honeycomb form, etc.

In an embodiment, the landing pads LP may each have various shapes such as a circle, an oval, a rectangle, a square, a rhombus, or a hexagon. However, the planar shape of the landing pad LP is not necessarily limited thereto and my have various other shapes.

The landing pads LP may be disposed on the first insulating pattern 115 and the second insulating pattern 141. The landing pads LP may directly contact the channel pattern CP. The landing pads LP may penetrate the upper insulation layer 150 and may directly contact the upper portion of the channel pattern CP.

For example, in an embodiment the landing pads LP may include a first portion LP1 extending in the first direction (e.g., the Y direction) and a second portion LP2 extending in the third direction (e.g., the Z direction) from the first portion LP1.

The first portion LP1 may directly contact a portion of the upper side of the gate insulating pattern Gox and the upper side of the second insulating pattern 141. The lower side of the first portion LP1 of the landing pad LP is shown in FIG. 3 to be disposed on the same level as the upper side of the first insulating pattern 115 and the upper side of the second insulating pattern 141. However, embodiments of the present disclosure are not necessarily limited thereto. For example in an embodiment, the lower side of the first portion LP1 of the landing pad LP may be disposed on a lower level than the upper sides of the first insulating pattern 115 and the second insulating pattern 141.

The second portion LP2 may overlap the first portion LP1 in the third direction (e.g., the Z direction), may extend in the third direction (e.g., the Z direction) from the lower side of the first portion LP1, and may directly contact the upper sides of the first and second perpendicular portions CP2 of the channel pattern CP.

In an embodiment, the second portion LP2 of the landing pad LIP may directly contact a portion of the lateral side of the first insulating pattern 115 and a portion of the lateral side of the gate insulating pattern Gox. In an embodiment, the lower side of the second portion LP2 may be disposed on a lower level than the upper sides of the word lines WL1 and WL2. However, embodiments of the present disclosure are not necessarily limited thereto.

Accordingly, the landing pad LP may be electrically connected to the horizontal portion CP1 of the channel pattern CP through the first and second perpendicular portions CP2 of the channel pattern CP. However, embodiments of the present disclosure are not necessarily limited thereto, and the landing pads LP may be arranged in many different ways when the landing pads LP are connected to the channel pattern CP.

In an embodiment, the landing pads LP may include doped polysilicon, a metal, a conductive metal nitride, a conductive metal silicide, a conductive metal oxide, or combinations thereof. For example, the landing pads LP may respectively include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof. However, embodiments of the present disclosure are not necessarily limited thereto.

The upper insulation layer 150 may fill the space among the landing pads LP disposed to be spaced apart in the first direction (Y direction) on the first insulating pattern 115 and the second insulating pattern 141. For example, in an embodiment the lower side of the upper insulation layer 150 may be disposed on the same level as the lower side of the first portion LP1 of the landing pads LP. However, embodiments of the present disclosure are not necessarily limited thereto. For example, in an embodiment the lower side of the upper insulation layer 150 may be disposed on a different level from the lower side of the first portion LP1 of the landing pads LP.

The data storage patterns DSP may be respectively disposed on the landing pads LP. The data storage patterns DSP may be electrically connected to the channel pattern CP through the landing pads LP. In an embodiment, the data storage patterns DSP, as shown in FIG. 1, may be arranged in a matrix format in the second direction (e.g., the X direction) and the first direction (e.g., the Y direction). However, embodiments of the present disclosure are not necessarily limited thereto.

In an embodiment, the data storage patterns DSP may be capacitors, and may include lower and upper electrodes, and capacitor dielectric layers disposed therebetween. In an embodiment in which the data storage patterns DSP have the above-described structure, the lower electrodes may directly contact the landing pad LP, and may have various forms such as a circle, an oval, a rectangle, a square, a rhombus, or a hexagon in a plan view. However, embodiments of the present disclosure are not necessarily limited thereto and the planar shape of the lower electrodes may vary.

Differing from this, in an embodiment the data storage patterns DSP may be variable resistor patterns that may be switched between two resistance states by electrical pulses applied to memory elements. For example, in an embodiment the data storage patterns DSP may include a phase-change material of which crystal states change according to a current amount, perovskite compounds, transition metal oxides, magnetic materials, ferromagnetic materials, or anti-ferromagnetic materials.

Figure 5:
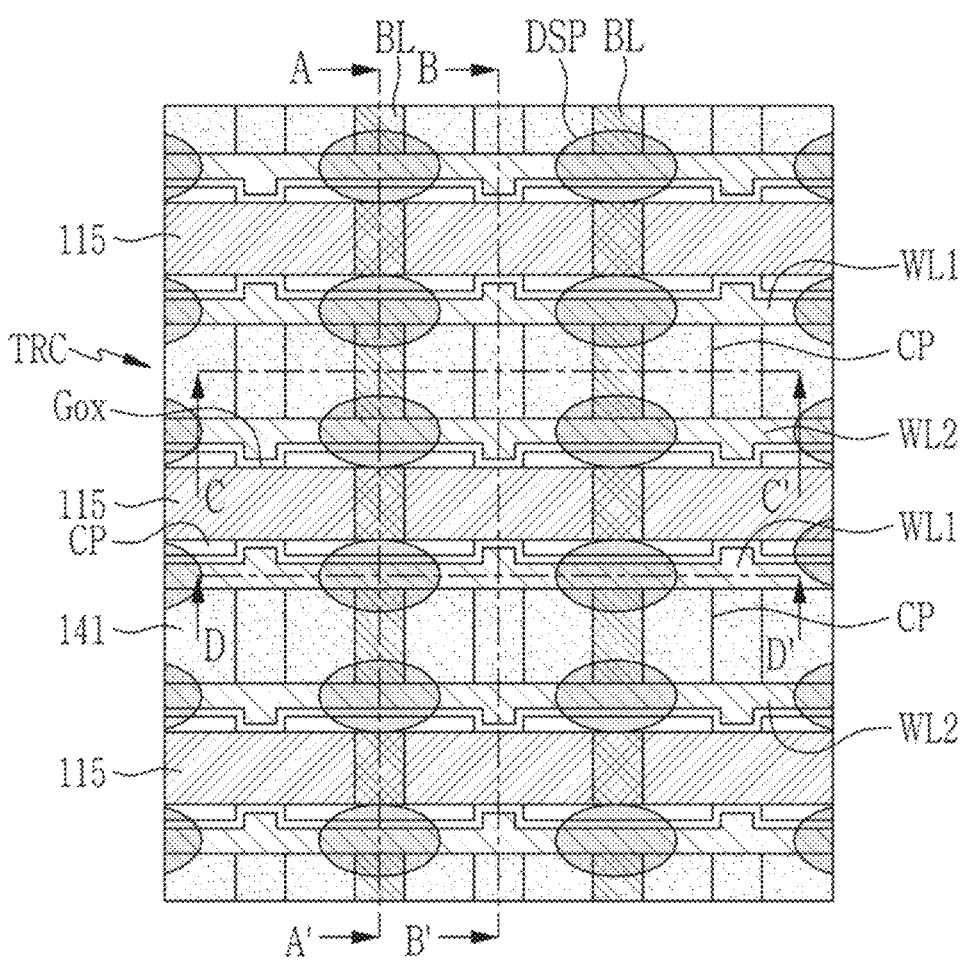
FIG. 5 shows a top plan view of a semiconductor device according to an embodiment.
Figure 5:
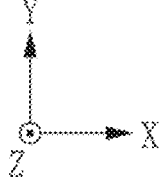
Figure 6:
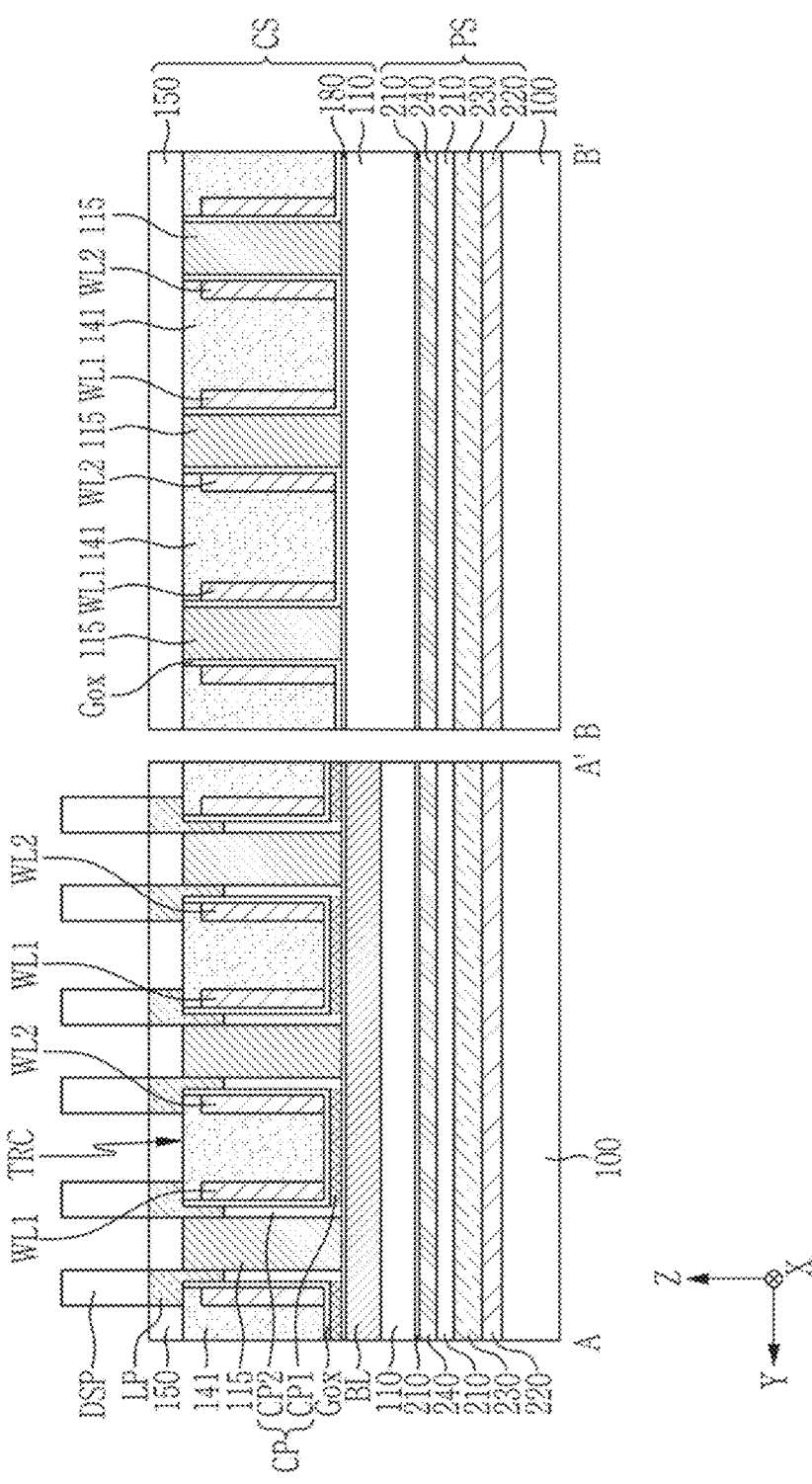
FIG. 6 shows a cross-sectional view with respect to lines A-A' and B-B' of FIG. 5.
Figure 7:
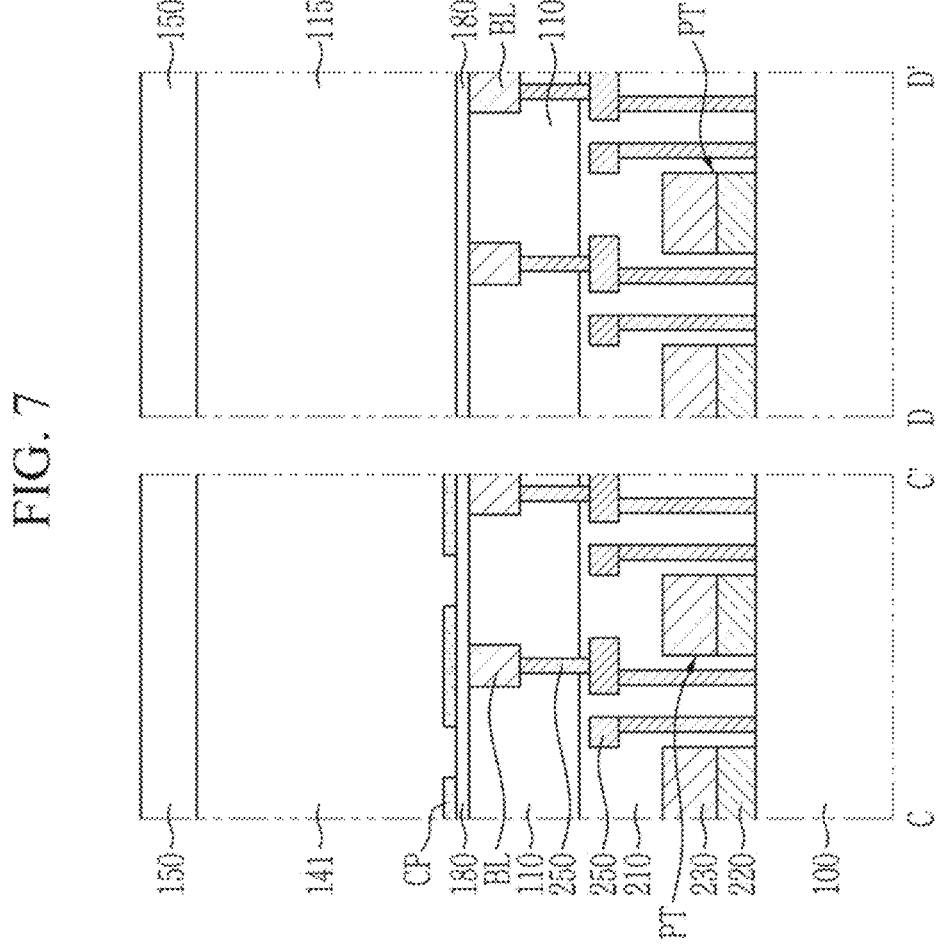
FIG. 7 shows a cross-sectional view with respect to lines C-C' and D-D' of FIG. 5.

FIG. 5 shows a top plan view of a semiconductor device according to an embodiment, FIG. 6 shows a cross-sectional view with respect to lines A-A' and B-B' of FIG. 5, and FIG. 7 shows a cross-sectional view with respect to lines C-C' and D-D' of FIG. 5.

Referring to embodiments shown in FIGS. 5 to 7, the semiconductor device may include a peripheral circuit structure body PS on the substrate 100, and a cell array structure body CS on the peripheral circuit structure body PS (e.g., in the Z direction).

The peripheral circuit structure body PS may include a peripheral circuit element PT and an inter-wire insulation layer 210 disposed on the substrate 100.

In an embodiment, the peripheral circuit element PT may include control elements and dummy elements, and may control functions of the semiconductor memory devices formed on the substrate 100. The inter-wire insulation layer 210 may cover the peripheral circuit element PT.

In an embodiment, the peripheral circuit element PT may include a first conductive pattern 220 and a second conductive pattern 230 sequentially formed (e.g., in the Z direction) on the upper side of the substrate 100. The first conductive pattern 220 and the second conductive pattern 230 may configure various circuit elements for controlling functions of the semiconductor memory devices. In an embodiment, the peripheral circuit element PT may include, for example, various types of passive elements such as capacitors, resistors, or inductors in addition to active elements such as transistors.

The peripheral circuit element PT and the inter-wire insulation layer 210 may be disposed below the interlayer insulating layer 180 (e.g., in the Z direction).

For example, the lower insulation layer 110 may be stacked on (e.g., stacked directly thereon in the Z direction) the upper side of the inter-wire insulation layer 210. In an embodiment, the interlayer insulating layer 180 may be stacked on (e.g., stacked directly thereon in the Z direction) the upper side of the lower insulation layer 110. For example, the semiconductor device may have a cell-on-peri (COP) structure.

The peripheral circuit element PT may be connected to the bit line BL. For example, a wire pattern 240 connected to the peripheral circuit element PT may be formed in the inter-wire insulation layer 210. An access via 250 for penetrating the lower insulation layer 110 and connecting the bit line BL and the wire pattern 240 with the interlayer insulating layer 180 therebetween may be formed. Hence, the bit line BL may be controlled by the peripheral circuit element PT.

In an embodiment, the cell array structure body CS may include memory cells including vertical channel transistors (VCT). The vertical channel transistor may represent a structure in which a channel length extends in the vertical direction (e.g., the Z direction) to the upper side of the substrate 100.

In an embodiment, the cell array structure body CS may include a lower insulation layer 110, a bit line BL, a first insulating pattern 115, a channel pattern CP, word lines WL1 and WL2, a second insulating pattern 141, a landing pad LP, an upper insulation layer 150, and data storage patterns DSP. The detailed description thereof corresponds to what is described with reference to FIG. 1 to FIG. 4 and will be omitted for economy of description.

A method for manufacturing a semiconductor device according to an embodiment will now be described with reference to FIGS. 8 to 20. In detail, FIGS. 8, 10, 12, 14, 16, and 19 show top plan views of a method for manufacturing a semiconductor device according to embodiments. FIGS. 9, 11, 13, 15, 17, 18, and 20 show cross-sectional views of a method for manufacturing a semiconductor device according to embodiments.

For better understanding and ease of description, portions that are repeated from the description provided with FIG. 1 to FIG. 7 may be simplified or omitted.

Figure 8:
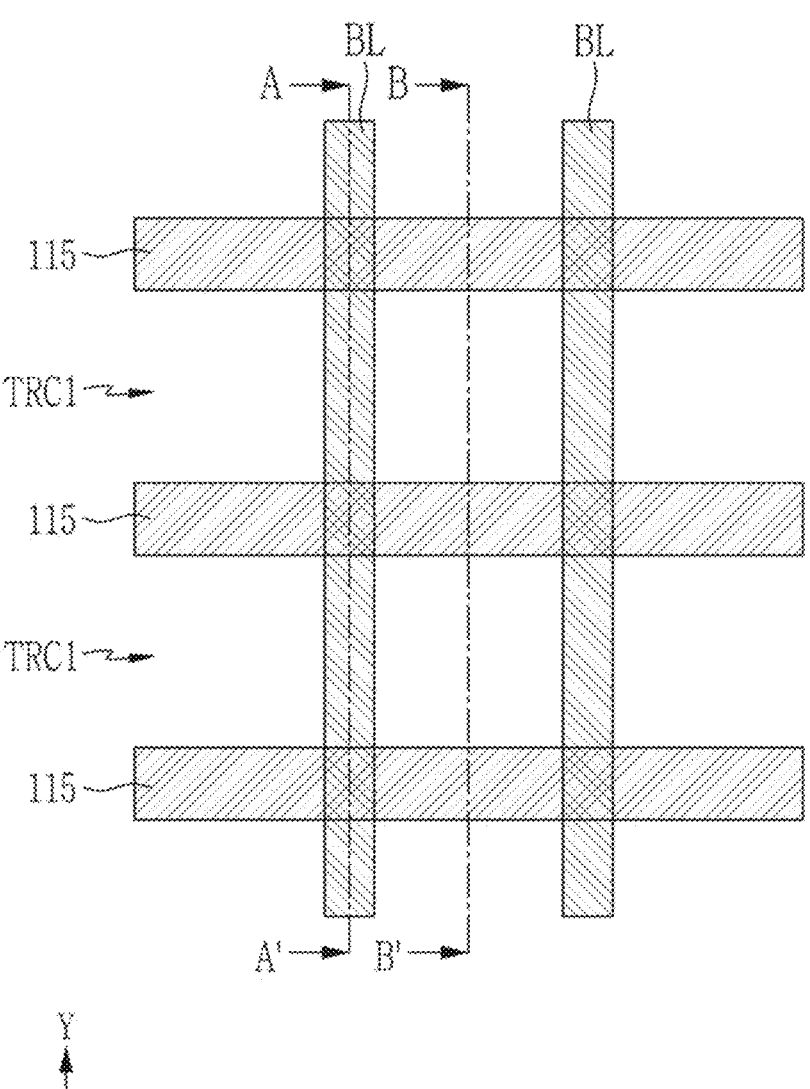
FIGS. 8, 10, 12, 14, 16, and 19 show top plan views of a method for manufacturing a semiconductor device according to embodiments.
Figure 9:
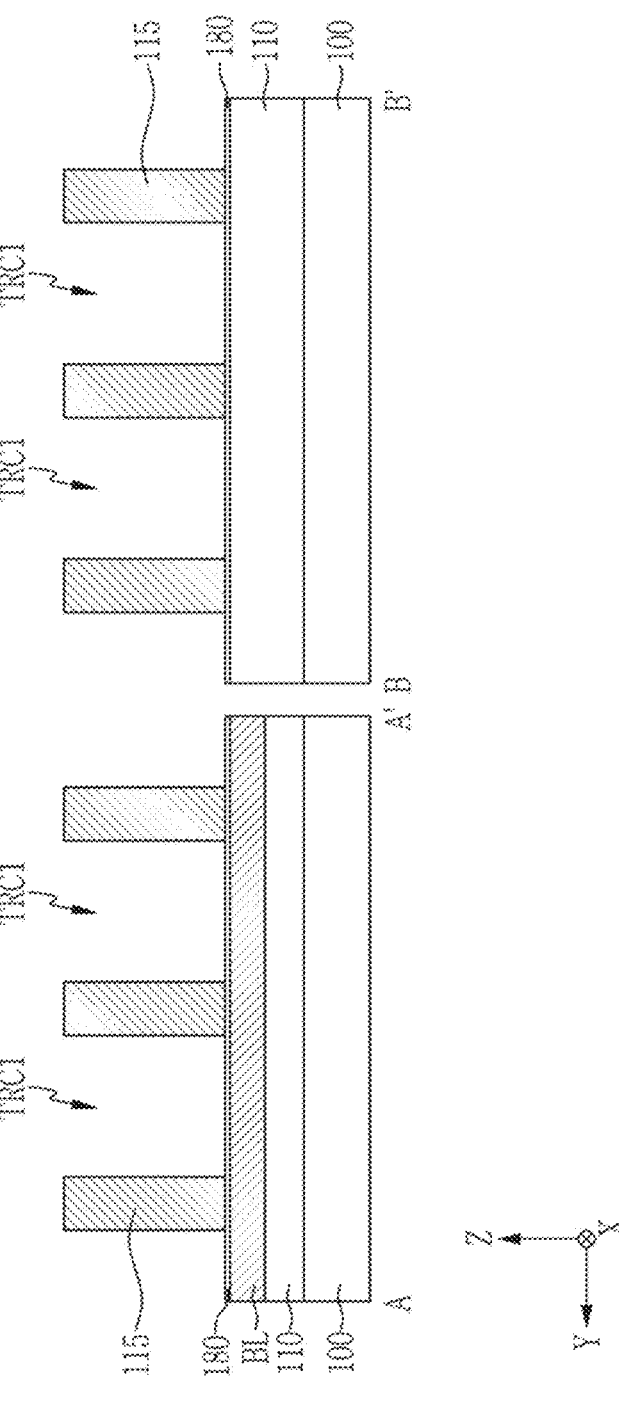
FIGS. 9, 11, 13, 15, 17, 18, and 20 show cross-sectional views of a method for manufacturing a semiconductor device according to embodiments.

Referring to FIG. 8 and FIG. 9, a bit line BL, an interlayer insulating layer 180, and a first insulating pattern 115 are formed on the substrate 100.

For example, a lower insulation layer 110 may be formed on the substrate 100 (e.g., formed directly thereon in the Z direction). The lower insulation layer 110 may include insulation layers stacked into a multilayer. For example, in an embodiment the lower insulation layer 110 may include a silicon oxide layer, a silicon nitride layer, a silicon oxynitride layer, and/or a low dielectric layer. However, embodiments of the present disclosure are not necessarily limited thereto.

A bit line BL may be formed on the lower insulation layer 110 (e.g., formed directly thereon in the Z direction). The bit line BL may extend in the first direction Y. A plurality of bit lines BL may respectively extend in the first direction Y, and may be spaced apart from each other at regular intervals in the second direction X traversing the first direction Y. An insulating material may be filled among the bit lines BL. In an embodiment, the bit lines BL may be formed by depositing a conductive layer on the lower insulation layer 110 and patterning the conductive layer.

An interlayer insulating layer 180 may be formed in the bit line BL. The interlayer insulating layer 180 may cover the upper side of the bit line BL and the upper side of the lower insulation layer 110.

In an embodiment, the interlayer insulating layer 180 may be formed by, for example, at least one of an atomic layer deposition (ALD) process and a chemical vapor deposition (CVD) process. However, embodiments of the present disclosure are not necessarily limited thereto.

In an embodiment, the interlayer insulating layer 180 may be formed to cover the bit line BL.

A first insulating pattern 115 may be formed that extends in the second direction X on the interlayer insulating layer 180 and defines first trenches TRC1 spaced from each other in the first direction (e.g., the Y direction). The first trench TRC1 may traverse the bit lines BL. In an embodiment, the first insulating pattern 115 may be made of, for example, a silicon oxide layer, a silicon nitride layer, a silicon oxynitride layer, and/or a low dielectric layer. However, embodiments of the present disclosure are not necessarily limited thereto.

Figure 10:
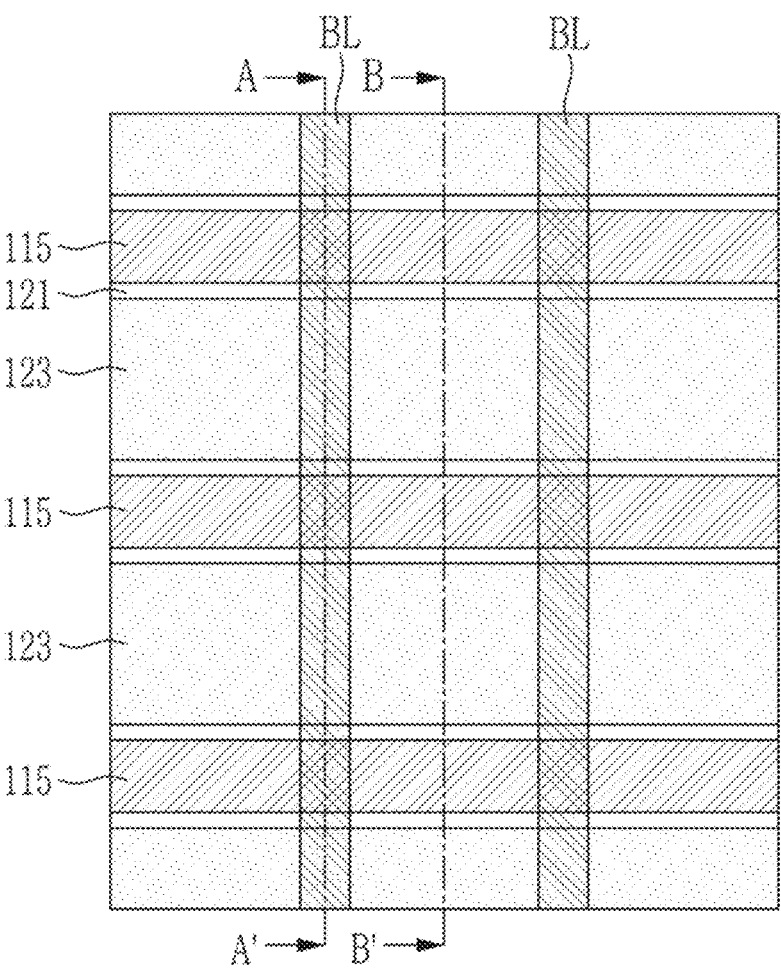
Figure 10:
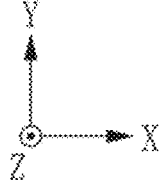
Figure 11:
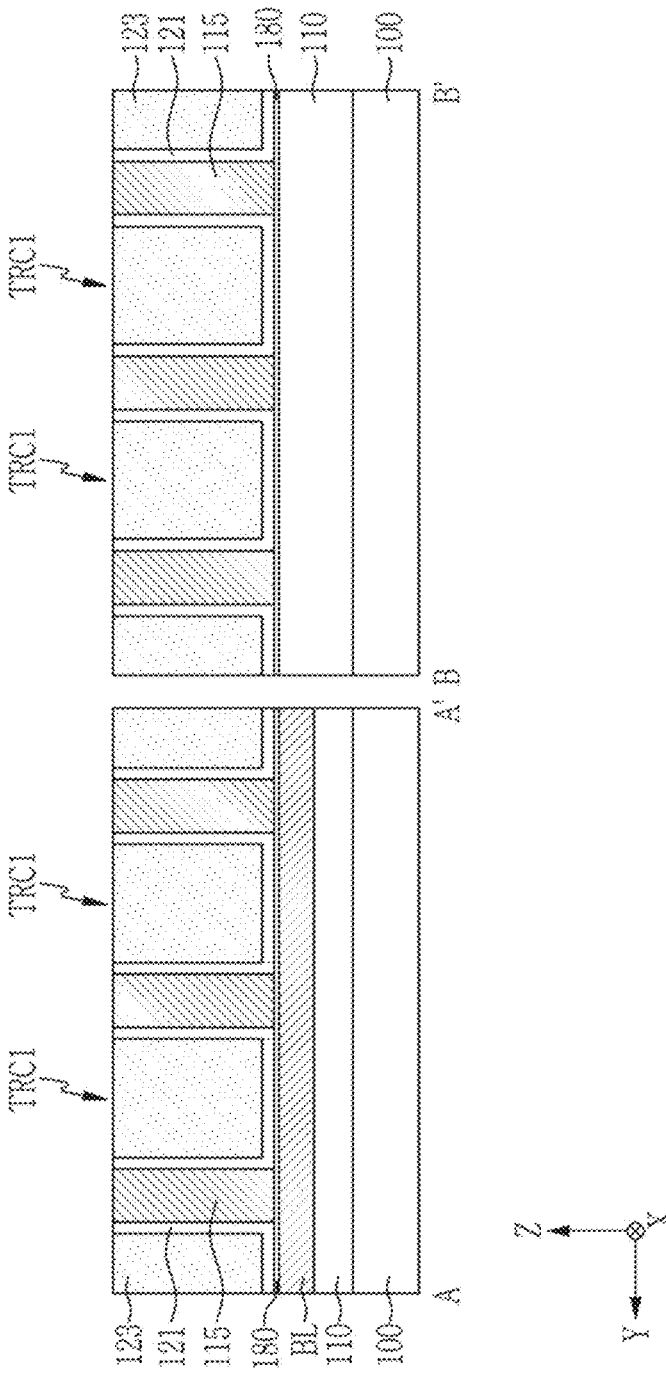

Referring to FIG. 10 and FIG. 11, preliminary channel patterns 121 may be respectively formed in the first trench TRC1. The preliminary channel patterns 121 may extend in the second direction X.

In an embodiment, the formation of the preliminary channel patterns 121 may include conformally depositing a channel film on the lower insulation layer on which the first insulating patterns 115 are formed, forming a sacrificial layer for filling the first trench TRC1 on the channel film, and planarizing the sacrificial layer and the channel film to expose the upper sides of the first insulating patterns 115. Hence, a preliminary channel pattern 121 and a sacrificial pattern 123 on the preliminary channel pattern 121 may be formed in the respective first trenches TRC1.

In an embodiment, the channel film may be formed by using at least one of PVD, thermal chemical vapor deposition (CVD), low-pressure chemical vapor deposition (LP-CVD), plasma-reinforced chemical vapor deposition (PE-CVD), or atomic layer deposition (ALD). However, embodiments of the present disclosure are not necessarily limited thereto. The channel film may cover bottom sides and interior walls of the first trenches TRC1 and may have a substantially constant thickness. In an embodiment, the thickness of the channel film may be less than a half the width of the trench. The channel film may be deposited to a thickness of, for example, several to several tens of nanometers, for example, about 1 nm to about 30 nm, or for example, about 1 nm to about 10 nm. In the present embodiment, the channel film may include an oxide semiconductor material, which has already been described.

In an embodiment, the sacrificial patterns 123 may be made of an insulating material having etching selectivity on the first insulating patterns 115. For example, the sacrificial patterns 123 may be one of insulating materials and a silicon oxide layer made by using a spin-on-glass (SOG) method.

Figure 12:
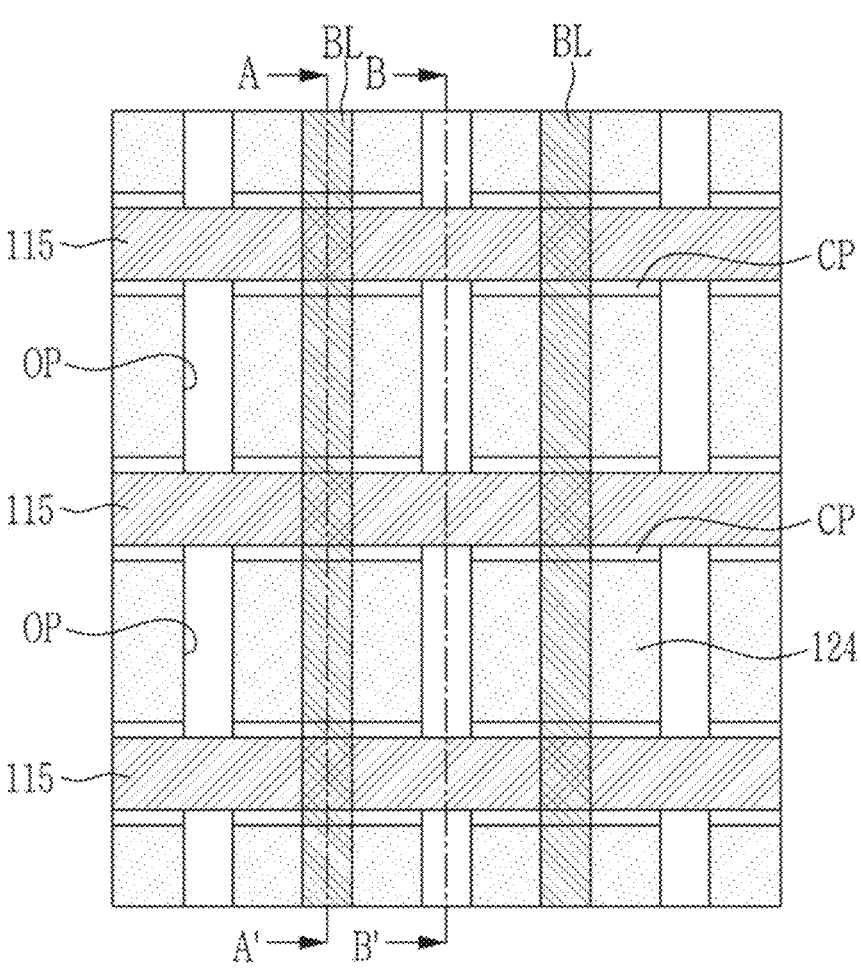
Figure 12:
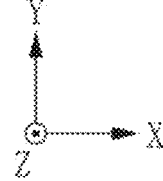
Figure 13:
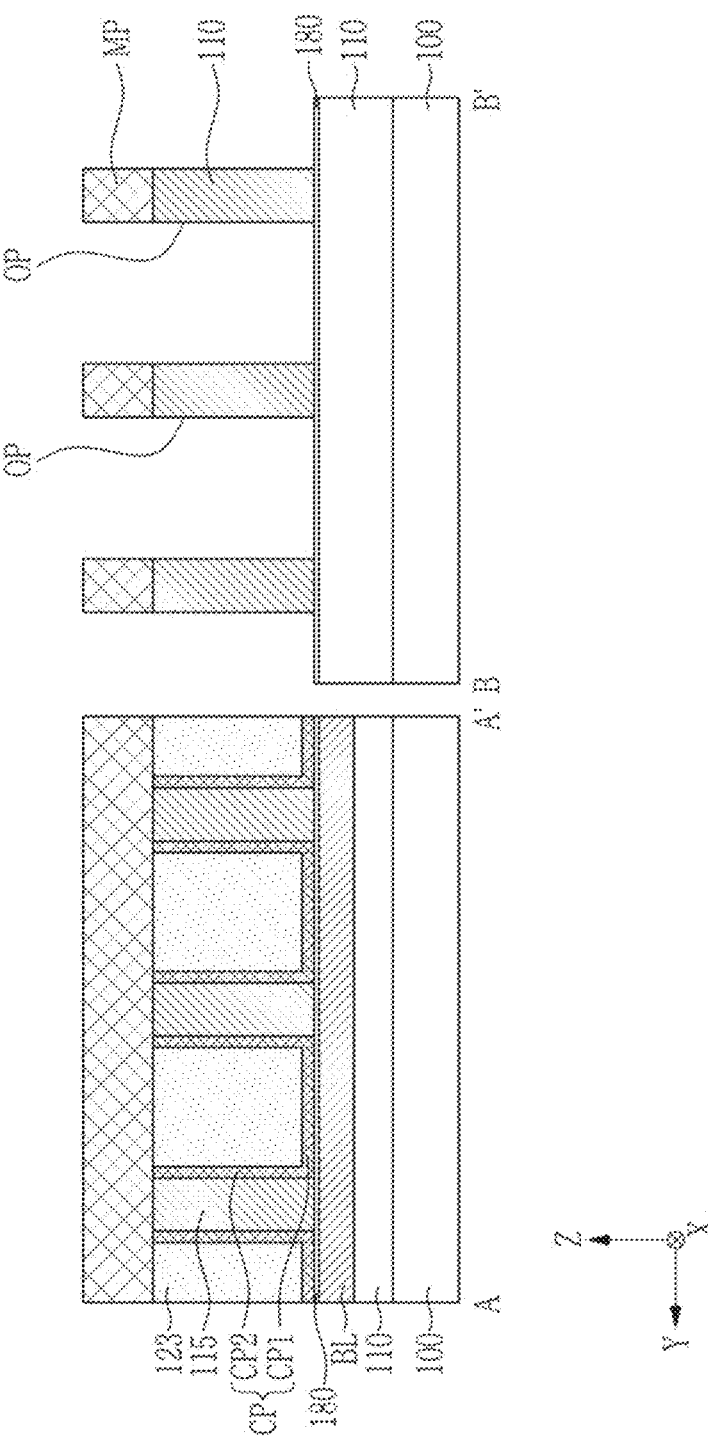

Referring to FIG. 12 and FIG. 13, the preliminary channel patterns 121 and the sacrificial patterns 123 are patterned to thus form the channel patterns CP spaced from each other in the second direction X in the first trench TRC1.

In an embodiment, the formation of the channel patterns CP may include forming a mask pattern MP on the preliminary channel patterns 121 and the sacrificial patterns 123, and sequentially etching the sacrificial patterns 123 and preliminary channel patterns 121 by use of the mask pattern MP as an etching mask to form openings OP for exposing the interlayer insulating layer 180.

For example, in an embodiment the openings OP may have a bar shape having a relatively long axis in the first direction Y, and may be spaced apart from each other in the first direction Y and the second direction X. The openings OP may be spaced apart from the bit lines BL in a plan view. However, embodiments of the present disclosure are not necessarily limited thereto. For example, in an embodiment the openings OP may have a linear shape extending in the first direction Y in parallel to the bit line, and may traverse the first insulating pattern 115.

The respective channel patterns CP formed as described above may include a horizontal portion CP1 directly contacting the bit line BL, and first and second perpendicular portions CP2 for covering respective sidewalls of the trench and connected to a first horizontal portion.

In an embodiment, when the channel pattern CP is formed, an etching process is performed to remove the mask pattern MP, and the sacrificial patterns 123 may be removed by using an etchant having etching selectivity on the first insulating pattern 115 and the channel pattern CP.

Figure 14:
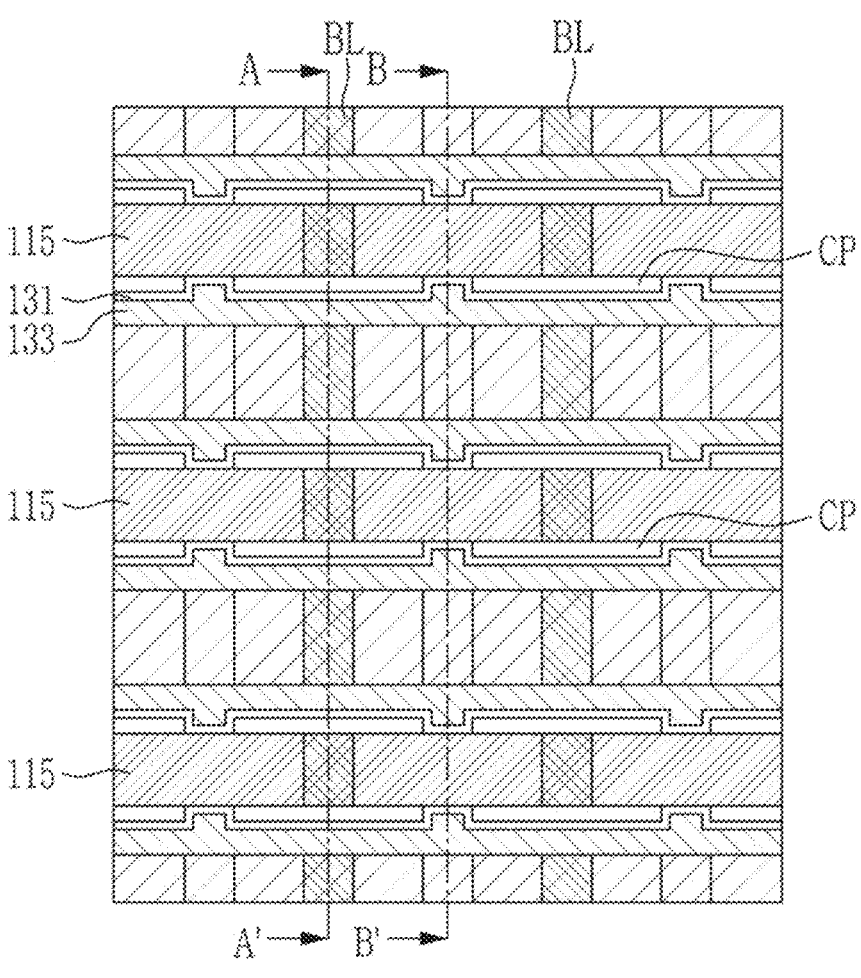
Figure 14:
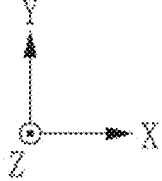
Figure 15:
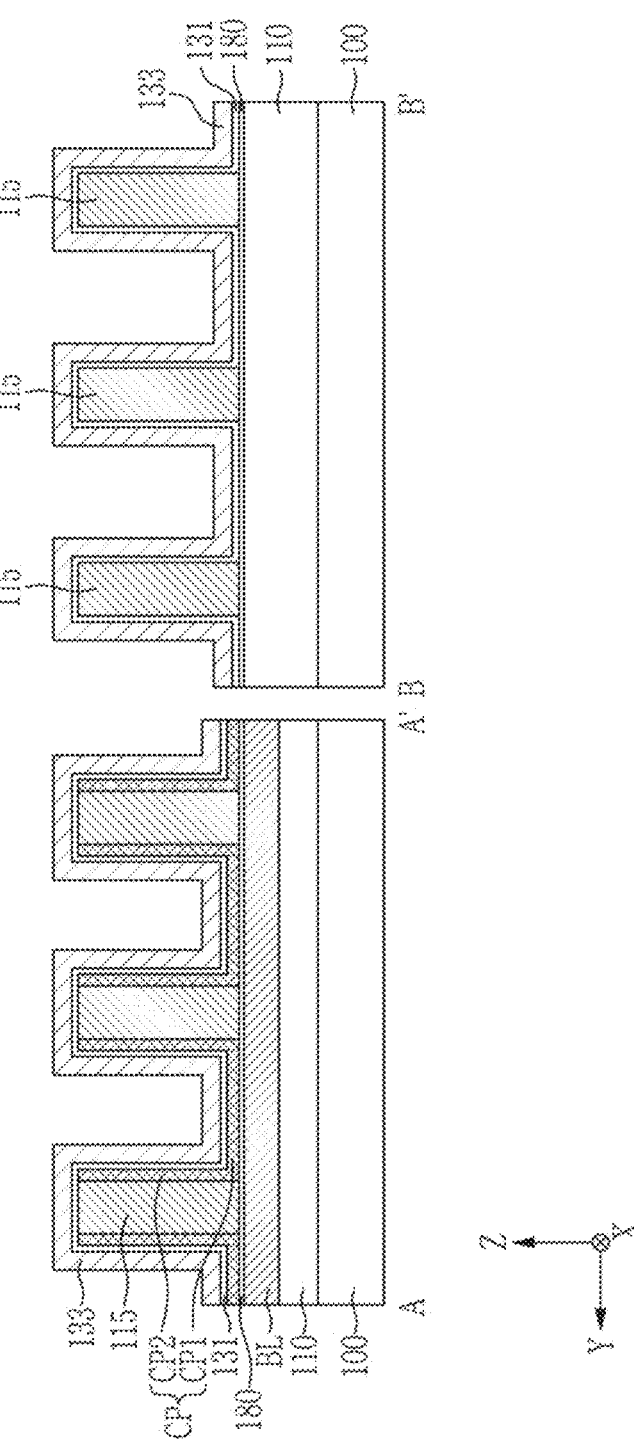

Referring to FIG. 14 and FIG. 15, the gate insulating layer 131 and the gate electrode layer 133 for conformally covering the channel patterns CP may be sequentially deposited. In an embodiment, the gate insulating layer 131 and the gate electrode layer 133 may be formed by using at least one of PVD, thermal chemical vapor deposition (CVD), low-pressure chemical vapor deposition (LP-CVD), plasma-reinforced chemical vapor deposition (PE-CVD), or atomic layer deposition (ALD).

In an embodiment, the gate insulating layer 131 and the gate electrode layer 133 may cover the horizontal portion CP1 and the first and second perpendicular portions CP2 of the channel pattern CP with a substantially constant thickness.

The gate insulating layer 131 may directly contact the first and second perpendicular portions CP2 of the channel pattern CP, the horizontal portion CP1, and the upper side of the first insulating pattern 115.

Figure 16:
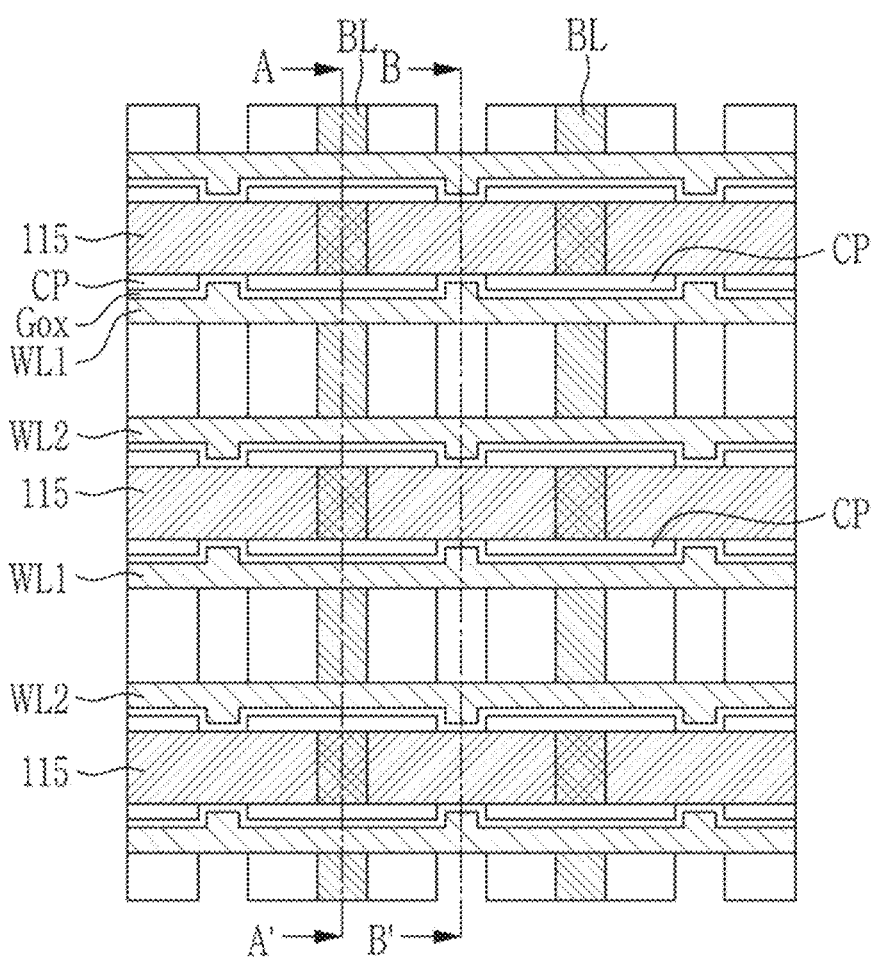
Figure 16:
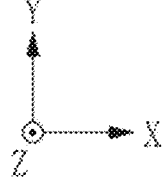
Figure 17:
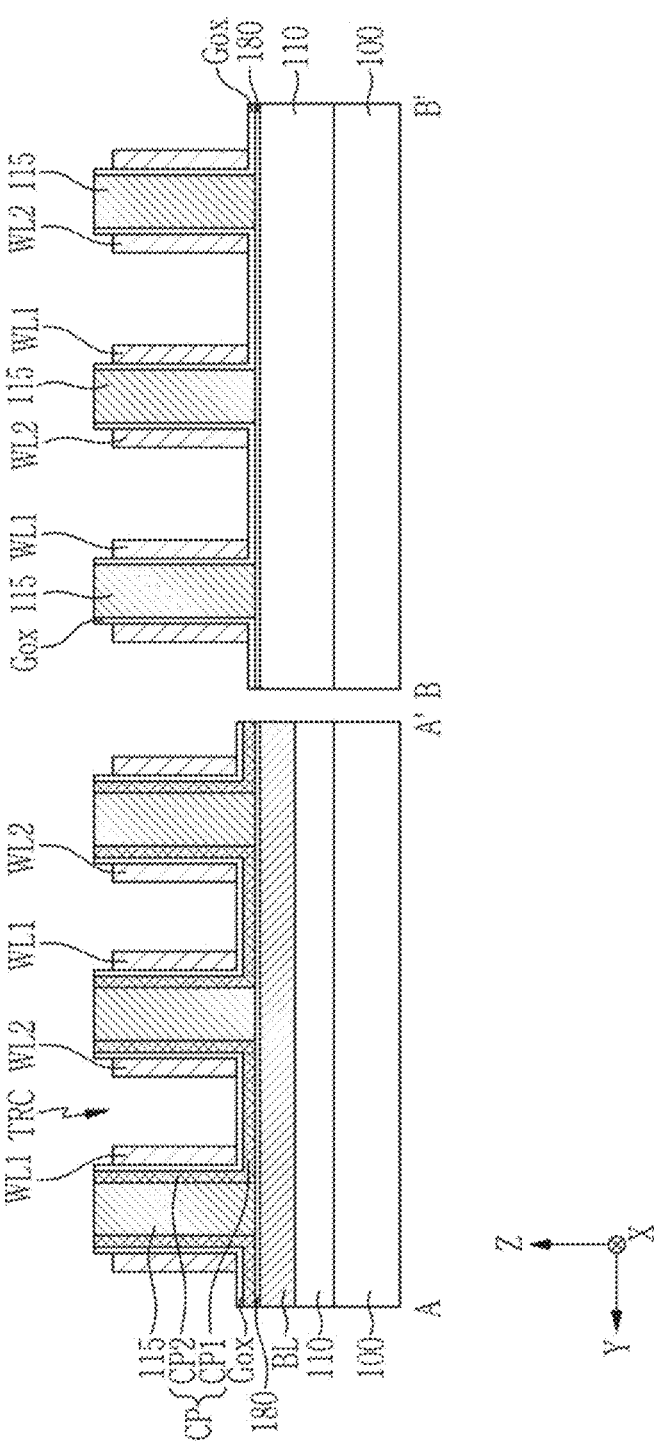

Referring to FIG. 16 and FIG. 17, in an embodiment a pair of first and second word lines WL1 and WL2 spaced apart from each other (e.g., in the Y direction) may be formed in the first trench TRC1 by performing an anisotropic etching process on the gate electrode layer 133. In an embodiment, when the anisotropic etching process on the gate electrode layer 133 is performed, the upper sides of the first and second word lines WL1 and WL2 may be lower than the upper side of the channel pattern CP. However, embodiments of the present disclosure are not necessarily limited thereto. For example, differing from this, an etching process for recessing the upper sides of the first and second word lines WL1 and WL2 may be additionally performed.

In an embodiment, when the anisotropic etching process on the gate electrode layer 133 is performed, the gate insulating pattern Gox may be etched together so a portion of the horizontal portion CP1 of the channel pattern CP may be exposed. Hence, as shown in FIG. 17, one pair of first and second gate insulating patterns Gox facing each other (e.g., in the Y direction) may be formed.

In an embodiment, when the anisotropic etching process on the gate electrode layer is performed, the gate insulating pattern Gox and the horizontal portion CP1 of the channel pattern CP may be sequentially etched and the interlayer insulating layer 180 may be exposed. Accordingly, the channel pattern CP may be formed to include one pair of first and second perpendicular portions CP2 separated from each other and facing each other in the first trench TRC1.

Figure 18:
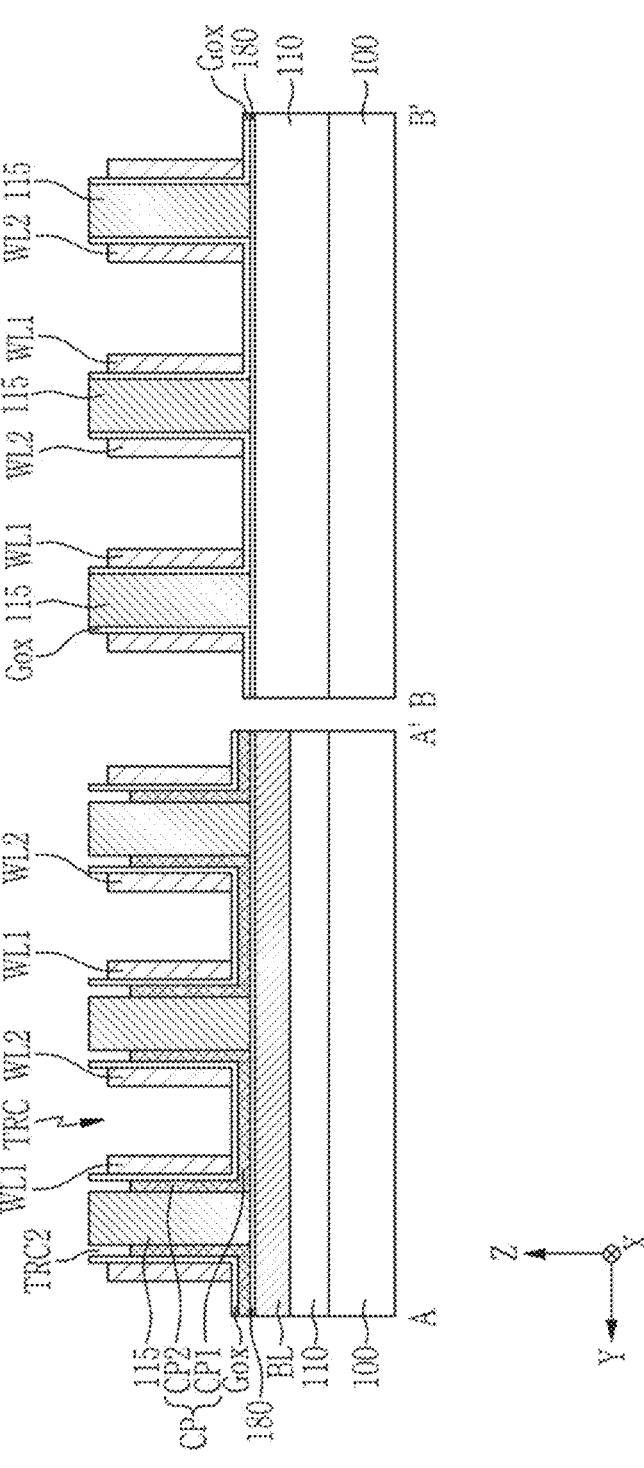

Referring to FIG. 18, in an embodiment the second trench TRC2 may be formed by the etching process for recessing part of the first and second perpendicular portions CP2 of the channel pattern CP.

For example, as the first and second perpendicular portions CP2 of the channel pattern CP are dry etched in the perpendicular direction from the upper side, the second trench TRC2 extending in the third direction (e.g., the Z direction) may be formed. The upper sides of the first and second perpendicular portions CP2 of the channel pattern CP are exposed by the second trench TRC2. However, the etching process for recessing the first and second perpendicular portions CP2 of the channel pattern CP is not necessarily limited thereto, and it may be modifiable in many ways.

Hence, the upper sides of the first and second perpendicular portions CP2 of the channel pattern CP may be disposed on a lower level than the upper sides of the word lines WL1 and WL2 and may exposed by the second trench TRC2.

Figure 19:
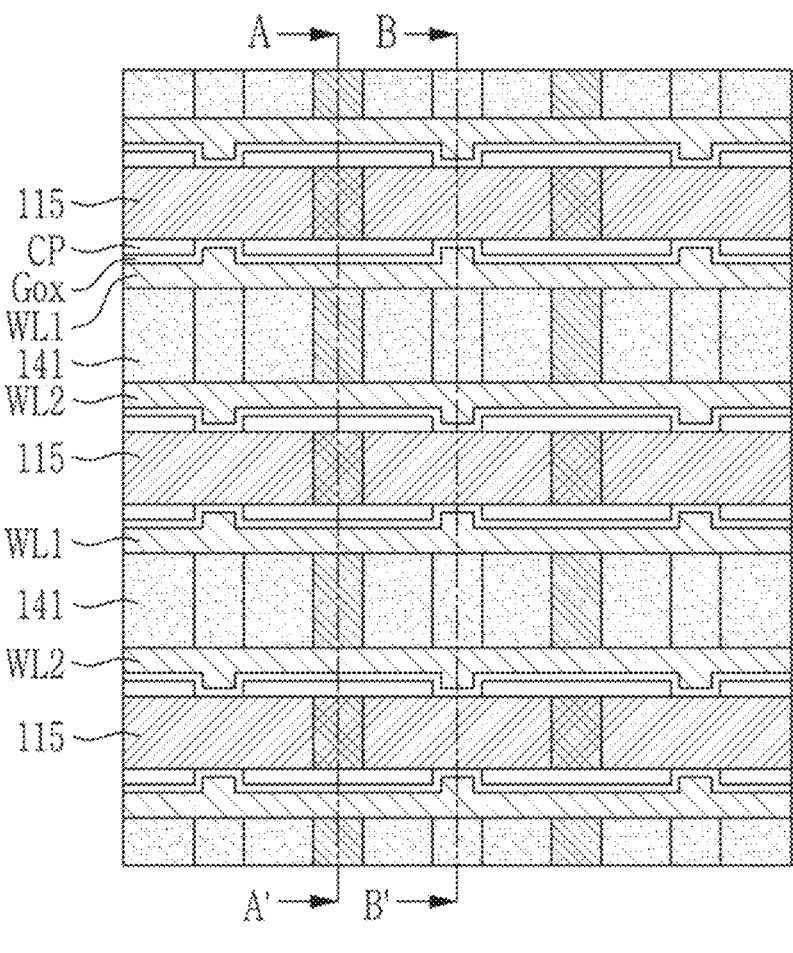
Figure 19:
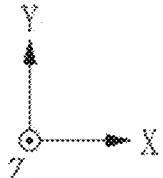
Figure 20:
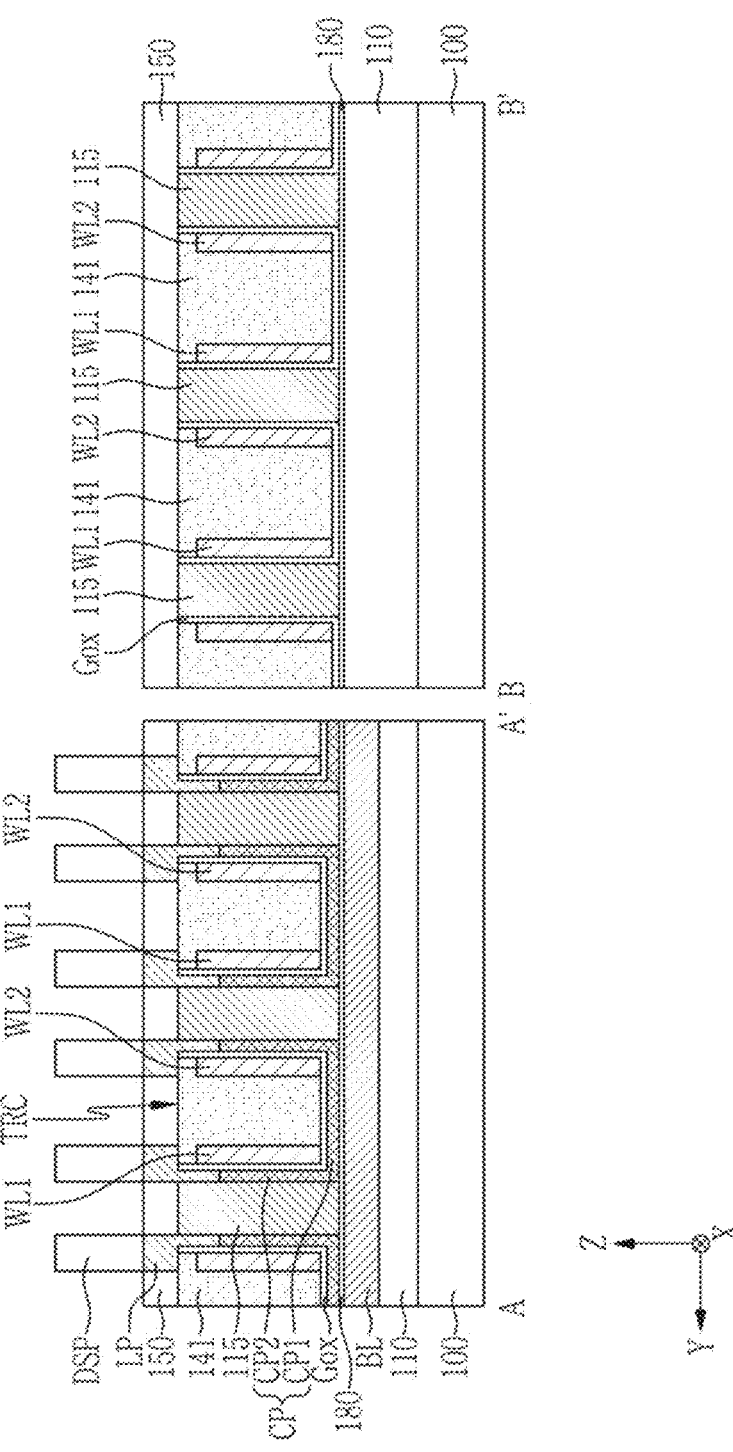

Referring to FIG. 19 and FIG. 20, a second insulating pattern 141 for filling the first trench TRC1 may be formed. In an embodiment, the second insulating pattern 141 may be made of, for example, a silicon oxide layer, a silicon nitride layer, a silicon oxynitride layer, and/or a low dielectric layer.

Landing pads LP may be formed on (e.g., formed directly thereon) the first insulating pattern 115, the second insulating pattern 141, the gate insulating pattern Gox, and the channel pattern CP. During this process, the landing pads LP may fill the second trench TRC2 and may directly contact the exposed portions of the first and second perpendicular portions CP2 of the channel pattern CP.

In an embodiment, holes for exposing the upper sides of the first insulating pattern 115 and the second insulating pattern 141 are formed by patterning the landing pads LP. The upper insulation layer 150 may be filled in the holes, and a planarization process may then be performed. However, the order for forming the landing pads LP and the upper insulation layer 150 is not necessarily limited to this order. For example, in some embodiments, the upper insulation layer 150 may be formed and patterned on the first insulating pattern 115, the second insulating pattern 141, the gate insulating pattern Gox, and the channel pattern CP, and the landing pads LP penetrating the upper insulation layer 150 may then be formed.

Data storage patterns DSP may be respectively formed on (e.g., formed directly thereon) the landing pads LP. In an embodiment, when the data storage patterns DSP include capacitors, lower electrodes, capacitor dielectric layers, and upper electrodes may be sequentially formed.

While this disclosure has been described in connection with non-limiting embodiments, it is to be understood that the present disclosure is not necessarily limited to the described embodiments, but, on the contrary, is intended to cover various modifications and equivalent arrangements.

What is claimed is:

1. A semiconductor device comprising:
a bit line extending in a first direction on a substrate;
a first insulating pattern disposed on the bit line;
a channel pattern disposed on an upper side of the bit line and a lateral side of the first insulating pattern, the channel pattern including an oxide semiconductor material;
a gate insulating pattern disposed on the channel pattern;
word lines disposed on the gate insulating pattern;
a second insulating pattern disposed on the word lines;
a landing pad disposed on the channel pattern; and
an interlayer insulating layer disposed between the bit line and the channel pattern.

2. The semiconductor device of claim 1, wherein:
the channel pattern includes first and second perpendicular portions facing each other and a horizontal portion connecting the first and second perpendicular portions to each other;
the horizontal portion is disposed on an upper side of the bit line; and
the first and second perpendicular portions are disposed on a lateral side of the first insulating pattern.

3. The semiconductor device of claim 1, wherein:
a thickness of the interlayer insulating layer is less than or equal to about 1 nm.

4. The semiconductor device of claim 1, wherein:
the bit line includes a plurality of bit lines spaced apart from each other in a second direction traversing the first direction.

5. The semiconductor device of claim 4, further comprising:
a lower insulation layer disposed between adjacent bit lines of the plurality of bit lines,
wherein the interlayer insulating layer is disposed to cover an upper side of the bit line, an upper side of the lower insulation layer and a bottom surface of the first insulating pattern.

6. The semiconductor device of claim 2, wherein:
the interlayer insulating layer is disposed in a region overlapping a horizontal portion of the channel pattern and the bit line.

7. The semiconductor device of claim 1, wherein:
the interlayer insulating layer includes at least one compound selected from $Al_2O_3$, ZnO, $TiO_2$, CdO, and $BaTiO_3$.

8. The semiconductor device of claim 1, wherein:
the oxide semiconductor material includes at least one material selected from an amorphous IGZO, an amorphous ITO, and an amorphous IGTO.

9. The semiconductor device of claim 2, wherein:
the word line includes first and second word lines facing each other, the first and second word lines are disposed between the first and second perpendicular portions and disposed above the horizontal portion.

10. The semiconductor device of claim 9, wherein:
the gate insulating pattern is disposed between the first perpendicular portion and the first word line and between the second perpendicular portion and the second word line.

11. A semiconductor device comprising:
a peripheral circuit structure body including a peripheral circuit element disposed on a substrate and an inter-wire insulation layer covering the peripheral circuit element;
a bit line disposed on the peripheral circuit structure body;
a first insulating pattern disposed on the bit line;
a channel pattern disposed on an upper side of the bit line and a lateral side of the first insulating pattern, the channel pattern including first and second perpendicular portions facing each other, and a horizontal portion connecting the first and second perpendicular portions to each other;
a gate insulating pattern covering the first and second perpendicular portions and the horizontal portion;
first and second word lines facing each other, the first and second word lines are disposed between the first and second perpendicular portions and on the gate insulating pattern;
a second insulating pattern disposed on the first and second word lines;
a landing pad disposed on the channel pattern; and
an interlayer insulating layer disposed between the bit line and the horizontal portion of the channel pattern.

12. The semiconductor device of claim 11, wherein:
a thickness of the interlayer insulating layer is less than or equal to about 1 nm.

13. The semiconductor device of claim 11, wherein:
the interlayer insulating layer includes at least one compound selected from $Al_2O_3$, ZnO, $TiO_2$, CdO, and $BaTiO_3$.

14. The semiconductor device of claim 11, wherein:
a lower side of the horizontal portion of the channel pattern directly contacts an upper side of the interlayer insulating layer.

15. The semiconductor device of claim 11, wherein:
the channel pattern includes an oxide semiconductor material.

16. The semiconductor device of claim 15, wherein:
the oxide semiconductor material includes at least one material selected from an amorphous IGZO, an amorphous ITO, and an amorphous IGTO.

17. A method for manufacturing a semiconductor device comprising:
forming a bit line extending in a first direction on a substrate;
forming an interlayer insulating layer on the bit line;
forming a first insulating pattern on the interlayer insulating layer;
forming a channel pattern on the interlayer insulating layer and the first insulating pattern;
forming a gate insulating pattern on the channel pattern;
forming a word line on the gate insulating pattern;
exposing at least a portion of the channel pattern;
forming a second insulating pattern on the word line; and
forming a landing pad on the exposed channel pattern.

18. The method of claim 17, wherein:
the forming of an interlayer insulating layer on the bit line is performed by using at least one process selected from atomic layer deposition and chemical vapor deposition.

19. The method of claim 17, wherein:
in the forming of an interlayer insulating layer in the bit line, the interlayer insulating layer is formed to have a thickness less than or equal to about 1 nm.

20. The method of claim 17, wherein:
in the forming of an interlayer insulating layer in the bit line, the interlayer insulating layer is formed by using a material including at least one compound selected from $Al_2O_3$, ZnO, $TiO_2$, CdO, and $BaTiO_3$.

\* \* \* \* \*